(12) United States Patent
Rivoir

(10) Patent No.: US 10,775,437 B2
(45) Date of Patent: Sep. 15, 2020

(54) TEST APPARATUS AND METHOD FOR TESTING A DEVICE UNDER TEST

(71) Applicant: Advantest Corporation, Tokyo (JP)

(72) Inventor: Jochen Rivoir, Magstadt (DE)

(73) Assignee: ADVANTEST CORPORATION, Tokyo (JP)

( * ) Notice: Subject to any disclaimer, the term of this patent is extended or adjusted under 35 U.S.C. 154(b) by 769 days.

(21) Appl. No.: 15/221,165

(22) Filed: Jul. 27, 2016

(65) Prior Publication Data

US 2016/0334466 A1    Nov. 17, 2016

Related U.S. Application Data

(63) Continuation of application No. PCT/EP2014/051831, filed on Jan. 30, 2014.

(51) Int. Cl.
*G01D 18/00* (2006.01)
*G01R 31/319* (2006.01)

(52) U.S. Cl.
CPC ................ *G01R 31/3191* (2013.01)

(58) Field of Classification Search
None
See application file for complete search history.

(56) References Cited

U.S. PATENT DOCUMENTS

| | | |
|---|---|---|
| 5,808,919 A | 9/1998 | Preist et al. |
| 6,106,567 A | 8/2000 | Grobman et al. |
| 6,212,492 B1 | 4/2001 | Kuge |
| 6,327,545 B1 * | 12/2001 | Browen ............ G01R 31/2801 324/601 |
| 6,397,160 B1 | 5/2002 | Craig et al. |
| 6,472,886 B2 | 10/2002 | Lee |
| 6,795,496 B1 | 9/2004 | Soma et al. |
| 6,937,046 B1 | 8/2005 | Kejariwal et al. |
| 7,051,240 B2 | 5/2006 | Manley et al. |
| 7,256,585 B1 | 8/2007 | Shoulders |
| 7,639,002 B1 | 12/2009 | Kejariwal et al. |
| 7,643,979 B2 | 1/2010 | Hong et al. |
| 9,564,876 B2 * | 2/2017 | Kim .................. H03H 17/0261 |
| 10,181,825 B2 * | 1/2019 | Ben Smida .......... H03F 1/3247 |

(Continued)

FOREIGN PATENT DOCUMENTS

| | | |
|---|---|---|
| EP | 0626588 | 11/1994 |
| EP | 0984291 | 3/2000 |

(Continued)

OTHER PUBLICATIONS

Nieuwoudt, I et al., "Algorithms for a Shared Resource Scheduling Problem in Which Some Level of Conflict is Tolerable," Journal of Scheduling, Kluwer Academic Publishers, vol. 15, No. 6, Sep. 29, 2012, pp. 681-702.

(Continued)

*Primary Examiner* — Aditya S Bhat

(57) ABSTRACT

A test apparatus for testing a device under test is configured to receive a response signal from the device under test and to apply one or more correction functions to the received response signal to at least partially correct an imperfection of the DUT. The test apparatus is configured to thereby obtain a corrected response signal of the device under test and to evaluate the corrected response signal to judge the device under test.

26 Claims, 12 Drawing Sheets

(56) References Cited

U.S. PATENT DOCUMENTS

| | | | |
|---|---|---|---|
| 10,473,703 B2* | 11/2019 | Bianchi | G01R 27/28 |
| 2004/0004466 A1 | 1/2004 | Miyanaga et al. | |
| 2005/0050546 A1 | 3/2005 | Remany et al. | |
| 2005/0068068 A1 | 3/2005 | Hall | |
| 2005/0234662 A1 | 10/2005 | Niedzwiecki et al. | |
| 2009/0092177 A1 | 4/2009 | Dvorak et al. | |
| 2009/0129129 A1 | 5/2009 | Udagawa | |
| 2009/0272634 A1 | 11/2009 | Ehlers et al. | |
| 2010/0225301 A1 | 9/2010 | Nakayama et al. | |
| 2010/0228515 A1 | 9/2010 | Srinivasan et al. | |
| 2010/0309952 A1 | 12/2010 | Asami | |
| 2010/0312506 A1 | 12/2010 | Taylor | |
| 2011/0227767 A1 | 9/2011 | O'Brien | |
| 2012/0049655 A1 | 3/2012 | Leyendecker et al. | |
| 2012/0221279 A1 | 8/2012 | Zhang | |
| 2013/0006567 A1 | 1/2013 | Horn | |
| 2013/0229068 A1 | 9/2013 | Sanders, III et al. | |
| 2013/0234723 A1 | 9/2013 | Behrens et al. | |

FOREIGN PATENT DOCUMENTS

| | | |
|---|---|---|
| EP | 1298778 | 4/2003 |
| JP | H11038087 | 2/1999 |
| JP | 2000009792 | 1/2000 |
| WO | 99/21025 | 4/1999 |
| WO | 2012/084028 | 6/2012 |
| WO | 2014/135194 | 9/2014 |

OTHER PUBLICATIONS

Liu, Lei, "Finite Automata for Evaluating Testbed Resource Contention," IEEE, Wireless Telecommunications Symposium WTS 2007, Piscataway, NJ, Apr. 26, 2007, pp. 1-6.

Quintanel, S., et al., "On-Wafer Multi-Port Circuits Characterization Technique with a Two-Port VNA," IEEE 81st ARFTG Microwave Measurement Conference, Seattle, WA, Jun. 7, 2013, pp. 1-4.

Lenk, F., et al., "A New Multiport Measurement-Method Using a Two-Port Network Analyzer," IEEE MTT-S International Microwave Symposium, Jun. 12-17, 2005, pp. 1663-1666.

Kam, D.G., et al., "Multiport Measurement Method Using a Two-Port Network Analyzer With Remaining Ports Unterminated," IEEE Microwave and Wireless Components Letters, vol. 17, No. 9, Sep. 2007, pp. 694-696.

Chen, C.-J., et al., "An Error Analysis of the Scattering Matrix Renormalization Transform," IEEE Transactions on Microwave Theory and Techniques, vol. 57, No. 4, Apr. 2009, pp. 863-868.

Rolfes, I., et al., "Multiport Method for the Measurement of the Scattering Parameters of N-Ports," IEEE Transactions on Microwave Theory and Techniques, vol. 53, No. 6, Jun. 2005, pp. 1990-1996.

Sismanoglou, P., et al, "Input Test Data Compression Based on the Reuse of Parts of Dictionary Entries: Static and Dynamic Approaches," IEEE Transactions on Computer-Aided Design of Integrated Circuits and Systems, vol. 32, No. 11, Nov. 2013, pp. 1762-1775.

White, H.E., "Printed English Compression by Dictionary Encoding," Proceedings of the IEEE, vol. 55, No. 3, Mar. 1967, pp. 390-396.

Ting, Shang-Kee et al., "An Algorithm to Compensate the Effects of Spurious PLL Tones in Spectrum Sensing Architectures", IEEE Transactions on Circuits and Systems, I: Regular Papers, vol. 59, No. 5, May 1, 2012, pp. 1093-1106.

Jamal, Shafiq M. et al., "Calibration of Sample-Time Error in a Two-Channel Time-Interleaved Analog-to-Digital Converter," IEEE Transactions on Circuits and Systems, I: Regular Papers, vol. 51, No. 1, Jan. 1, 2004, pp. 130-139.

Marple, S. Lawrence Jr., "Computing the Discrete-Time 'Analytic' Signal via FFT," IEEE Transactions on Signal Processing, vol. 47, No. 9, Sep. 1, 1999, pp. 2600-2603.

* cited by examiner

TEST APPARATUS AND METHOD FOR TESTING A DEVICE UNDER TEST

CROSS-REFERENCE TO RELATED APPLICATION

This application is a continuation of copending International Application No. PCT/EP2014/051831, filed Jan. 30, 2014, which is incorporated herein by reference in its entirety.

BACKGROUND OF THE INVENTION

Embodiments of the present invention relate to a test apparatus for testing a device under test. Further embodiments of the present invention relate to a method for testing a device under test. Further embodiments of the present invention relate to a tester for testing a device under test. Other embodiments relate to a method for testing a device under test and to a computer program.

To minimize power consumption, RF power amplifiers are operated at marginal supply voltage levels. This drives them into compression, leading to strong inter-modulation products. Digital predistortion (DPD) of the baseband I/O inputs mitigates this effect. For further power reduction, supply voltages may dynamically track the RF envelope, also known as envelope tracking (ET). Digital predistortion is usually performed as part of a straightforward test consisting of two test steps. In a first step, the device's non-linearity is computed from its response to a fixed test waveform. In a second step, an individually predistorted waveform is computed, downloaded and applied to each device being tested in order to measure the remaining non-linearity after predistortion. This second step causes a significant test time penalty, especially in multi-site test, since downloads must be executed serially with respect to the tested devices. This test time penalty results in a high time effort when testing and judging a device under test.

In addition, DUTs of a production series, a production lot or of the same type may comprise deviations between single DUTs, such as production or material tolerances, errors or failures. Therefore DUTs may show deviant behavior, i.e., deviant signal response to identical signal input. Also qualitative parasitic effects like dirt, e.g., on printed circuit boards of a DUT, may lead to deviations of the behavior.

Hence, for example, there is a need for a reduction of the test time of such tests. A reduced test time would help to increase testing capacities of a tester testing the devices under test and therefore lead to a higher throughput of a tester testing the devices under test.

SUMMARY

An embodiment may have a test apparatus for testing a device under test -DUT-, comprising a tester configured: to receive a response signal from the DUT; to apply one or more correction functions to the received response signal, to at least partially correct an imperfection of the DUT, to thereby obtain a corrected response signal of the DUT; and to evaluate the corrected response signal to judge the DUT.

Another embodiment may have a test apparatus for testing a device under test -DUT-, comprising a tester configured: to receive a response signal from the DUT; to determine at least one correction parameter of one or more correction functions such that the one or more correction functions are adapted to at least partially correct an imperfection of the DUT when the one or more correction functions are applied to the received response signal; and to evaluate the at least one correction parameter of the one or more correction functions to judge the DUT.

Another embodiment may have an apparatus for testing a device under test -DUT-, comprising a system is configured to be connected to at least one DUT and to input an input signal to the DUT; wherein the system has either of the test apparatuses as mentioned above.

According to another embodiment, a method for testing a device under test -DUT- may have the steps of: receiving a response signal from the DUT; applying one or more correction functions to the received response signal, to at least partially correct an imperfection of the DUT, to thereby obtain a corrected response signal; and evaluating the corrected response signal to judge the DUT.

According to still another embodiment, a method for testing a device under test -DUT- may have the steps of: receiving a response signal from the DUT; determining at least one parameter of one or more correction functions, such that the one or more correction functions are adapted to at least partially correct an imperfection of the DUT when the one or more correction functions are applied to the received response signal; and evaluating the at least one parameter of the one or more correction functions to judge the DUT.

Another embodiment may have a computer program for performing either of the above methods.

Embodiments of the present invention relate to a test apparatus for testing a device under test. The test apparatus is configured to receive a response signal from the device under test and to apply one or more correction functions to the received response signal, to at least partially correct an imperfection of the device under test. Thereby, a corrected response signal of the device under test is obtained. The test apparatus is configured to evaluate the corrected response signal to judge the device under test dependent on the corrected response signal.

It has been found by the inventors that a test apparatus which is configured to correct a received response signal of the device under test and to judge the device under test dependent from the corrected response signal may eliminate the second test step of the conventional predistortion-based test. Instead of predistorting the test waveform (for example, based on a first measurement result), its response is corrected to predict an expected response to a predistorted signal without actually applying a predistorted waveform to the device under test. By eliminating the second test step of the predistortion-based test and therefore the need for an individual upload of the predistorted waveform to each device under test, a considerable amount of test time may be saved, leading to a higher throughput of a tester that may be a testing system.

As an example, the corrected response signal may be evaluated by a spectral analysis and compared to a result of a corresponding evaluation of an input signal of the device under test. Deviations between the input signal and the corrected output signal, e.g., deviations of the spectra, may be evaluated to decide whether the device under test fulfills pre-defined requirements, e.g., a certain grade of linearity.

Further embodiments of the invention relate to a test apparatus for testing a device under test. The test apparatus is configured to receive a response signal from the device under test and to determine at least one correction parameter of one or more correction functions. The one or more correction functions are adapted to at least partially correct an imperfection of the device under test when the one or more correction functions are applied to the received response signal. The test apparatus is further configured to evaluate the at least one correction parameter to judge the device under test.

By evaluating the at least one correction parameter instead of evaluating a corrected response signal, judging the device under test may be performed (as an example) by determining whether the at least one parameter is within pre-defined boundaries or not.

Further embodiments relate to a method for testing a device under test. The method comprises receiving a response signal from the device under test. One or more correction functions are applied to the received response signal to at least partially correct an imperfection of the device under test and to thereby obtain a corrected response signal. The corrected response signal is evaluated to judge the device under test.

Further embodiments relate to a method for testing a device under test. A response signal is received from the device under test. At least one correction parameter of one or more correction functions is determined, such that the one or more correction functions are adapted to at least partially correct an imperfection of the device under test when the one or more correction functions are applied to the received response signal. The at least one correction parameter is evaluated to judge the device under test.

Further embodiments of the present invention relate to a method and a computer program for testing a device under test.

BRIEF DESCRIPTION OF THE DRAWINGS

Embodiments of the present invention will be described in more detail taking reference to the accompanying figures in which.

DETAILED DESCRIPTION OF THE INVENTION

Before embodiments of the present invention are described in detail, it is to be pointed out that the same or functionally equal elements are provided the same reference numbers and that a repeated description of elements having the same reference numbers is omitted. Hence, descriptions provided for elements having the same reference numbers are mutually exchangeable. Some explanations relate to signals which comprise an amplitude and a phase.

Subsequently, Latin and Greek characters are used for quantities related to amplitudes and phases, respectively. Particularly, stimulus amplitude and phase are denoted as $s[n]$ and $\sigma[n]$, while response amplitude and phase are denoted as $r[n]$ and $\rho[n]$. An index p denotes predistorted waveforms, an index m denotes a modeled waveform and an index c denotes corrected waveforms.

In the following, a number of models are used to describe functionalities of apparatus that may be part of embodiments of the invention. Some embodiments are configured to be connectable to devices under test. Devices under test and apparatus may receive or process signals, wherein a device under test may be configured to receive and to output a physical (analogue or digital) signal. In contrast, a tester or a test apparatus that is configured to process a received signal, e.g., using a software, may be configured to perform processing using digital representations of such a received or processed signal when handling or computing based on those signals. A digital representation may be received, for example, by sampling a physical signal and by representing the physical signal by the sampled values. As a physical signal may be converted to a digital representation thereof, and as the digital representation may be converted to a physical signal, it is obvious to those skilled in the art, that a physical signal and a physical representation thereof may be used as an equivalent when describing functionalities of an apparatus processing the signals. Thus, in the following, the terms signal and digital representation of the signal are used as equivalents.

Some Figures relate to a model evaluator which is configured to evaluate a model of a device, such as a DUT, or a correction or the like. The respective model to be evaluated may be, for example, a mathematical expression of a behavior of the respective device. In the following the declarations model and model evaluator may be used as synonyms when referring to the respective model to be evaluated.

Figure 1:
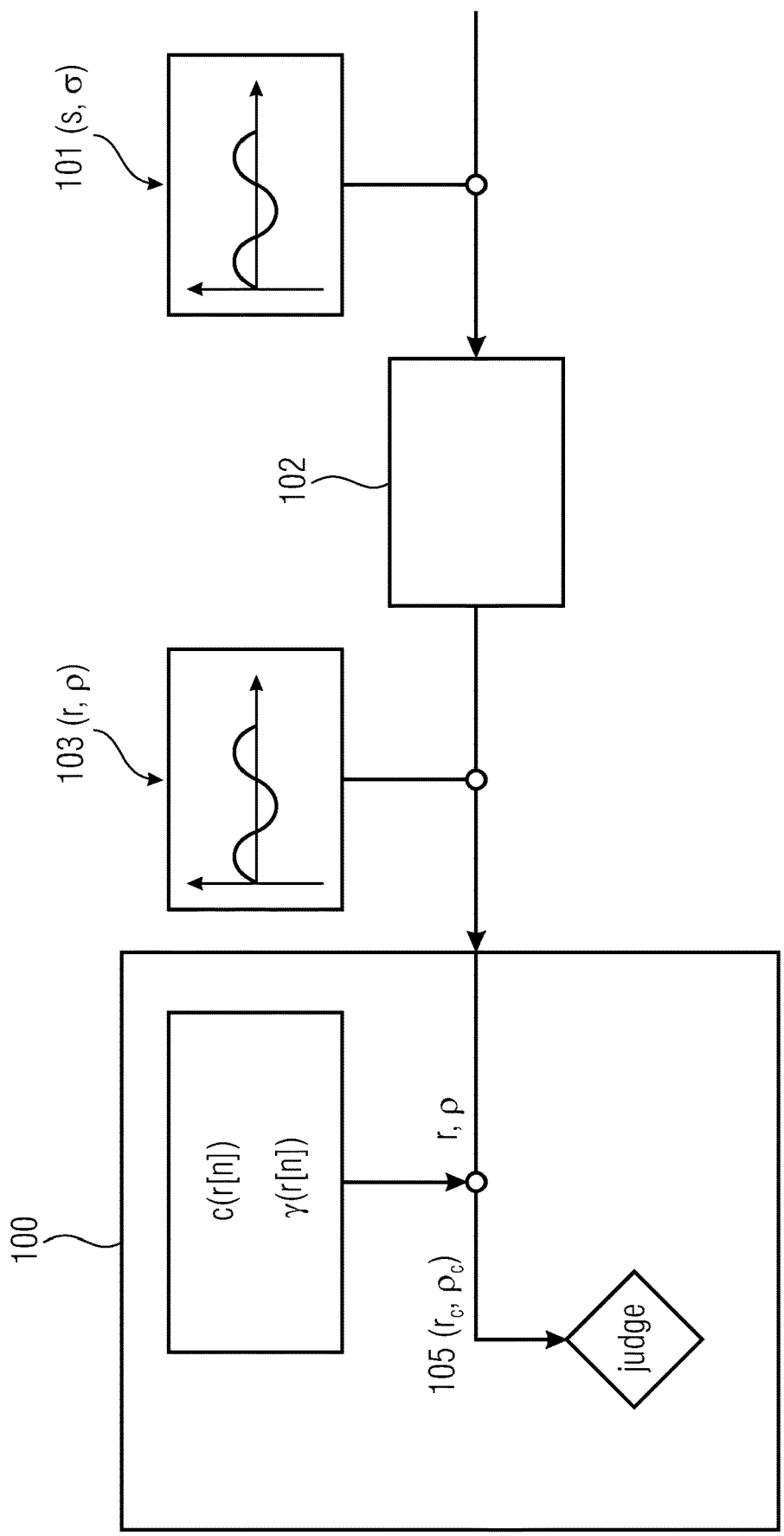
FIG. 1 shows a block schematic diagram of a test apparatus for testing a device under test (DUT)

FIG. 1 shows a schematic block diagram of a test apparatus 100 for testing a device under test (DUT) 102. The test apparatus 100 is configured to receive a response signal 103 from the DUT 102. The received response signal 103 comprises, for example, an amplitude r and a phase $\rho$. The test apparatus 100 is configured to apply one or more correction functions (for example, $c(r[n])$ and/or $\gamma(r[n])$) to the received response signal 103 to at least partially correct an imperfection of the DUT. The correction functions $c(r[n])$ and/or $\gamma(r[n])$ are functions which may, for example, depend on the actual time step n within $n=1 \ldots N$ and preceding time steps $1 \ldots N-1$. A time step n can be for example a sample step during sampling a signal. The denotation of $r[n]$ with r written in fat letters is used to indicate that $r[n]$ is a vector including preceding time steps of $r[n]$ which denotes the amplitude r at time step n.

Apparatus 100 is configured enable a judgment with respect to imperfections of a DUT, for example during a quality test before shipping the DUT or for determining correction parameters which may be used during later operation of the DUT (e.g., equalizing). An imperfection of the DUT can comprise, for example, a static non-linearity, a dynamic non-linearity or a combination of static and dynamic non-linearities. When the DUT is a RF power amplifier, such non-linearities have the effect that the output signal 103 of the amplifier is distorted with respect to an input signal 101 of the amplifier, which is to be amplified. An ideal amplifier amplifies a stimulus amplitude s[n] of the input signal 101 by a constant factor m, such that the amplitude r[n] of the corresponding output signal 103 (response signal) can be expressed by r[n]=m·s[n], while leaving a phase σ[n] of the input signal 101 unchanged, such that the phase ρ[n] of the received response signal 103 equals the phase σ[n] of the input signal 101, which may be expressed by ρ[n]=σ[n]. The factor m is also referred to as a gain factor. A compressed amplifier exhibits a reduced gain, modeled as amplitude-to-amplitude modulation, which may be expressed by r=m(s), and a phase shift. The phase shift can be modeled as an amplitude-to-phase modulation, which can be expressed by ρ−σ=μ(s), wherein ρ−σ denotes the phase shift. For any reasonable compression, the function r=m(s) is a smooth, strictly monotonous and thus invertible function. Both, the amplitude-to-amplitude modulation r=m(s) and the amplitude to phase modulation ρ=σ+μ(s) are each a function of the amplitude s[n] of the input signal 101. For small amplitudes s[n] both, the reduction of the gain and the phase shift can be approximately zero. For increasing respectively high amplitudes both, the reduction of the gain (compression) and the phase shift will typically start to increase non-linearly with increasing amplitude s[n]. Thus, compression induced gain reduction and phase shift are typically static non-linearities particularly as a dependency m(s) and/or μ(s) is in the main static and approximately only dependent from the amplitude s[n].

Dynamic non-linearities, e.g., temperature dependencies, will likely add further non-idealities to the received output (response) signal 103 of the DUT 102 (amplifier). The temperature in the power amplifier depends on the accumulated signal power, which may be expressed as a squared amplitude of the signal, reduced by thermal resistances. Thus, such dynamic non-linearities depend not only on the instantaneous stimulus amplitude s[n] but also on the most recent amplitudes s[n], s[n−1] . . . , i.e., non-linearities can be intermingled with frequency dependent states (the most recent amplitudes). Such systems can be described using Volterra series, which allow fully generic modeling of non-linear dynamic systems. A consideration of different time steps of the Volterra series enables a consideration of frequency-dependencies. As an example, this is shown for amplitude-to-amplitude modulation:

$$r[n] = \sum_{i} A_i s[n-i] + \sum_{i,j} B_{ij} s[n-i]s[n-j] + \ldots + \sum_{i,j,\ldots,k} C_{ij\ldots k} s[n-i]s[n-j] \cdot \ldots \cdot s[n-k]$$

FIR filters for linear frequency-dependency, i.e., the first sum, and tailor series for static non-linearities, i.e., indices i, j, . . . , k are equal, are special cases of Volterra series. Instead of products of delayed samples, other application-specific basis functions can be used as well:

$$r[n] = \sum_{i} A_i f_i(s[n-i]) + \sum_{i,j} B_{ij} g_{ij}(s[n-i]s[n-j]) + \ldots + \sum_{i,j,\ldots,k} C_{ij\ldots k} h_{ij\ldots k}(s[n-i]s[n-j]) \ldots s[n-k])$$

wherein f, g, h denote the other application-specific basis functions.

Candidates of suitable basis functions include logarithmic, exponential or sigmoid terms. A reasonably small, sufficiently covering subset of Volterra terms can be determined, e.g., by applying engineering judgment. An acceptable number of Volterra coefficients should be selected such that the model is sufficiently corrected, wherein an overspending of Volterra terms and/or coefficients leads to a computational effort that might be too high. Embodiments show a test apparatus that utilizes 5, 7, 10, 12 or 15 Volterra terms and/or coefficients.

The above described method can be applied to fully generic Volterra series, which can also be formulated in a condensed form:

$$M: \begin{cases} r[n] = m(s[n]) = \sum_{j=1}^{J} m_j T_j[n] \\ \rho[n] = \mu(s[n]) = \sigma[n] + \sum_{k=1}^{K} \mu_k \Theta_k[n] \end{cases}$$

with basis functions $$T_j[n]=T_j(s[n]), \Theta_k[n]=\Theta_k(s[n])$$

and stimulus amplitude history vector $$s[n]=[s[n],s[n-1],s[n-2],\ldots]'$$

wherein M denotes model for the DUT.

Figure 2:
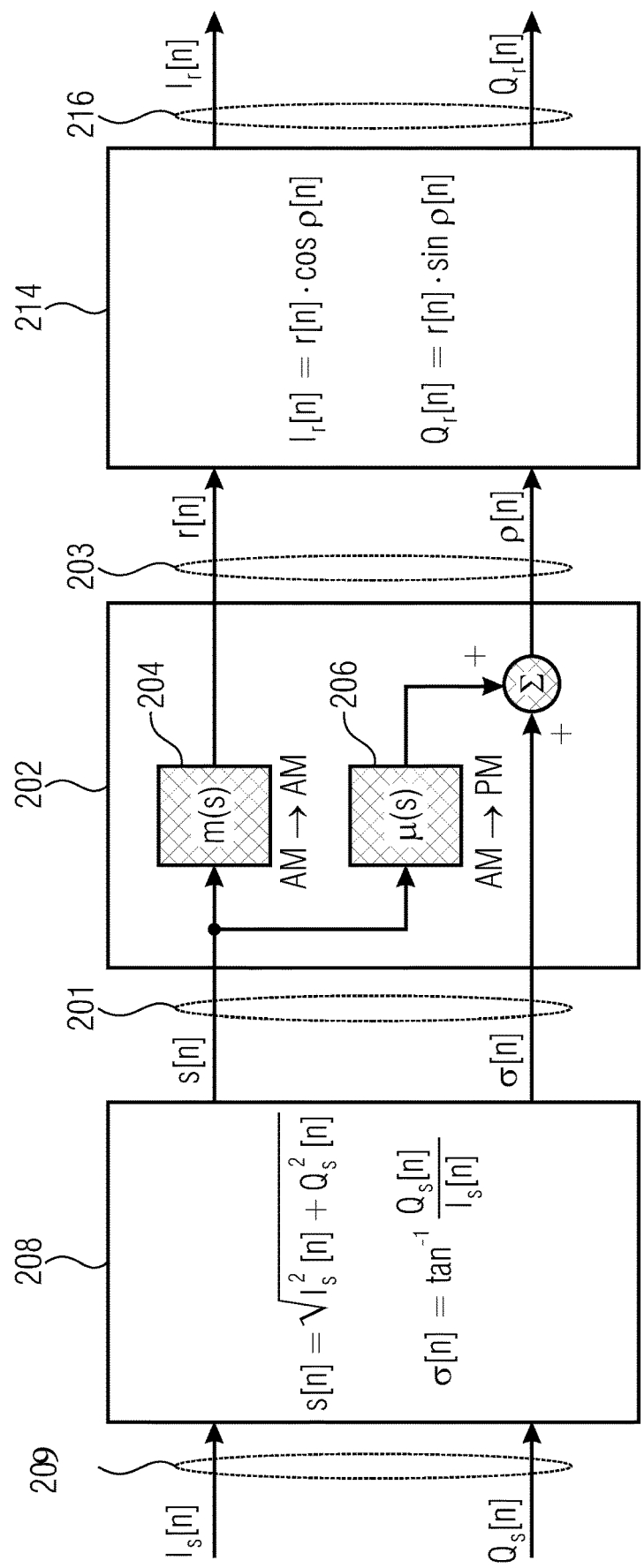
FIG. 2 shows a schematic block diagram of a non-linear compression model of the DUT.

This generic form also covers the static model described by equations explained in FIG. 2 and still cover the general case, if the instantaneous stimulus amplitude s[n] is replaced with the stimulus amplitude history vector s[n].

The test apparatus 100 is configured to apply one or more correction functions, for example, c(r[n]) and/or γ(r[n]) to the received response signal 103 with r and ρ to at least partially correct imperfections of static and/or dynamic non-linearities of the DUT 102. By applying the one or more correction functions c(r[n]) and/or γ(r[n]), a corrected response signal 105 is obtained. The corrected response signal 105 comprises an amplitude $r_c$ and a phase $\rho_c$. The test apparatus 100 is configured to evaluate the corrected response signal 105 to judge the DUT 102. The evaluation can be performed, for example, by evaluating one or more criteria. A criteria may be a relative (e.g., 50%, 100% or 1,000%) or an absolute (e.g., 0.1 V, 5 V or 100 V) value of the amplitude compression at one or more frequencies of the input signal 101, a stability of frequencies of the received response signal 103 or a phase response of the DUT 102 determined or estimated by applying the correction functions to the received response signal 103. The evaluation may also comprise a comparison of the input signal 101 of the DUT 102 (or of a scaled or otherwise processed version thereof) with the corrected response signal 105. When the corrected response signal 105 is within a certain deviation interval with respect to the input signal 101 of the DUT 102, the DUT may be judged as fulfilling requirements (the DUT 102 may be judged as "ok").

Alternatively, the correction functions c(r[n]) and/or γ(r[n]) can be formed as a linear sum of the basis functions $$r_c[n] = c(r[n]) = \sum_{j=1}^{J} c_j C_j[n]$$

-continued $$\rho_c[n] = \gamma(r[n]) = \sigma[n] + \sum_{k=1}^{K} \gamma_k \Gamma_k[n]$$

$C_j[n]$ is a basis function with index j and weighted by a weighting factor $c_j$. The linear sum of basis functions equals the sum of J weighted basis functions with j=1 to J. The phase correction function $\gamma(r[n])$ can be formed as the phase o[n] of the input signal 101 summed with the linear sum of weighted phase basis functions $\Gamma_k[n]$, each weighted by the weighting factor $\gamma_k$, wherein the linear sum of phase basis functions comprises K basis functions and weighting factors with k=1 to K. The weighting factors $c_j$ and $\gamma_k$ are correction parameters that can be adapted, such that each basis function $C_j[n]$ and $\Gamma_k[n]$ and therefore the sums of basis functions are configured to correct the received response signal 103.

As an alternative to correct the received response signal 103 and to evaluate the obtained corrected response signal 105, the apparatus 100 can be configured to evaluate the weighting factors, respectively the correction parameters $c_j$ and $\gamma_k$, for example on the basis of the response of the DUT. This can enable a direct comparison of the correction parameters $c_j$ and $\gamma_k$ to pre-defined ranges of parameters. As an example, apparatus 100 can be configured to judge a DUT 102 as fulfilling a specification in case $c_1$ is between 2 and 3 and $\gamma_3$ is between 5 and 7. In other words, the computed correction functions are applied to the received response signal 103 to at least partially correct an imperfection of the DUT, e.g., static or dynamic non-linearities.

Apparatus 100 is configured to determine the amplitude $r_c[n]$ of the corrected response 105 signal at a time step n, for example, according to the formula $$r_c[n] = c(r[n]) = \sum_{j=1}^{J} c_j C_j[n]$$

and the corresponding phase $\rho_c[n]$ according to the formula $$\rho_c[n] = \gamma(r[n]) = \sigma[n] + \sum_{k=1}^{K} \gamma_k \Gamma_k[n]$$

The correction parameters $c_j$ and $\gamma_k$ may propagate linearly to an error $\varepsilon$, for example by iteratively determining a mean square error. The basis function $C_j[n]$ is a function of the amplitude r[n] of the received response signal 103 as it can be seen by the formula $C_j[n]=C_j(r[n])$ The phase base function $\Gamma_k[n]$ is also a function of the amplitude r[n] of the received response signal 103 as it can be seen by the formula $\Gamma_k[n]=\Gamma_k(r[n])$ To determine correction functions and/or correction parameters to correct the received response signal 103, the apparatus 100 can utilize a respective signal which describes a target state of the received response signal 103 or a desired response signal, which the DUT 102 is expected to output when having no or tolerable extent of errors or imperfections. Based on the target state of the received response signal 103 (or the desired response signal), deviations between the target state and the corrected response signal 105 may be evaluated by the test apparatus 100 to judge the DUT 102. However, the desired response signal may be determined in the presence of a predistortion of the input signal 101 of the DUT 100, while the actual response signal of the DUT may be obtained without a predistortion of the input signal 101 of the DUT 102, or at least without an adaption of the predistortion to a correctly tested DUT.

The expected output signal may be determined by the test apparatus 100 utilizing models of the DUT 102, which allow for a mathematical determination of a modeled output signal with an amplitude $r_{pm}$ and a phase $\rho_{pm}$ as it will be described in FIG. 3. When the test apparatus 100 is configured to utilize a model M of the DUT 102 and therefore a model of the expected imperfections of the DUT 102, the test apparatus may be configured to determine deviations between the desired (expected) response signal and the corrected response signal 105.

The correction functions may be adapted to reduce or minimize the deviation between the desired response signal and the corrected response signal 105 by adapting the correction functions or corrections parameters and thus the performed correction. For example, the correction functions or correction parameters may be adapted to compensate for the absence of a predistortion (or for an emission of an adaption of the predistortion to the currently tested DUT 102).

Therefore, minimizing a mean square error with respect to $c_j$ and $\gamma_k$ can be performed as a simple quadratic optimization problem which can be expressed by the formula $$\{c_j\} = \operatorname*{argmin}_{\{c_j\}} \sum_{n=1}^{N} (r_c[n] - r_{pm}[n])^2$$
$$= \operatorname*{argmin}_{\{c_j\}} \sum_{n=1}^{N} \left( \sum_{j=1}^{J} c_j C_j[n] - r_{pm}[n] \right)^2$$

and $$\{\gamma_k\} = \operatorname*{argmin}_{\{\gamma_k\}} \sum_{n=1}^{N} (\rho_c[n] - \rho_{pm}[n])^2$$
$$= \operatorname*{argmin}_{\{\gamma_k\}} \sum_{n=1}^{N} \left( \sigma[n] + \sum_{k=1}^{K} \gamma_k \Gamma_k[n] - \rho_{pm}[n] \right)^2$$

This is equivalent to solving a system of linear equations $$\underbrace{\begin{pmatrix} C_1[1] & \cdots & C_J[1] \\ \vdots & \ddots & \vdots \\ C_1[N] & \cdots & C_J[N] \end{pmatrix}}_{C} \cdot \underbrace{\begin{pmatrix} c_1 \\ \vdots \\ c_J \end{pmatrix}}_{c} = \underbrace{\begin{pmatrix} r_{pm}[1] \\ \vdots \\ r_{pm}[N] \end{pmatrix}}_{r_{pm}}$$

and $$\underbrace{\begin{pmatrix} \Gamma_1[1] & \cdots & \Gamma_K[1] \\ \vdots & \ddots & \vdots \\ \Gamma_1[N] & \cdots & \Gamma_K[N] \end{pmatrix}}_{\Gamma} \cdot \underbrace{\begin{pmatrix} \gamma_1 \\ \vdots \\ \gamma_K \end{pmatrix}}_{\gamma} = \underbrace{\begin{pmatrix} \rho_{pm}[1] \\ \vdots \\ \rho_{pm}[N] \end{pmatrix}}_{\rho_{pm}}$$

wherein C is a matrix comprising values of the amplitude base correction functions $C_j[n]$, j=1 . . . J for time steps n=1 ... N, wherein c is a vector of all weighting correction factors $c_j$, j=1 ... J, and wherein $r_{pm}$ is a vector of the amplitudes $r_{pm}[n]$ for n=1 ... N. $\Gamma$ is a matrix comprising values of the phase base correction functions $\Gamma_k[n]$, k=1 ... K for time steps n=1 ... N, wherein $\rho_{pm}$ is a vector of all weighting correction factors $c_j$, j=1 ... J, and wherein $\rho_{pm}$ is a vector of the phases $\rho_{pm}[n]$ for n=1 ... N.

The solution of the system of linear equations is $$c=(C'C)^{-1}C'r_{pm}$$

and $$\gamma=(\Gamma'\Gamma)^{-1}\Gamma'\rho_{pm}$$

The test apparatus 100 is configured to determine the at least one correction parameter based on the received response signal 103 and to evaluate the corrected response signal 105 to avoid applying a second and/or individual test signal to the DUT 102. In other words, while computing the solution of the equations, the device under test 102 is outside the optimization loop, which allows the test apparatus 100 to work with a single captured response signal 103 for a given DUT 102.

The DUT's non-linearity can be corrected by the test apparatus 100 as a post-processing step performed in software. Compared with a re-executing in terms of computing a pre-distorted waveform and uploading the pre-distorted waveform to the DUT (in hardware), this can save test time and may allow covering more temperature- and frequency-dependent non-linearities. The temperature- and frequency-dependent non-linearities can be described by Volterra models.

A modeling of a DUT may, for example, be implemented using Cartesian or polar coordinates. Since a predistortion based test and/or judgment is conventionally performed in the (sampled) baseband domain and since compression of the amplifier depends on the stimulus envelope amplitude s[n], it can be convenient to model the RF device under test, namely the amplifier, in polar coordinates at baseband samples n, i.e. in terms of stimulus amplitude s[n] and phase $\sigma[n]$ and as opposed to Cartesian coordinates of the stimulus $I_s[n]$ and $Q_s[n]$, with transformations $$s[n]=\sqrt{I_s^2[n]+Q_s^2[n]}$$

and $$\sigma[n]=\tan^{-1}\frac{Q_s[n]}{I_s[n]}$$

or vice versa $$I_s[n]=s[n]\cdot\cos\sigma[n]$$

or $$Q_s[n]=s[n]\cdot\sin\sigma[n].$$

For performing a software-based test to judge the device under test 102 or to determine correction parameters of the DUT 102 to implement a correction, a model of the DUT 102 can be used to simulate DUT's behavior at a workstation or a computer, which may, for example, be part of a tester configured to test the DUT 102. Such models may, for example, simulate or emulate DUT's behavior, e.g., by modeling the compression of a RF power amplifier with a linear or a non-linear compression model, such that the models may be used by model evaluators which may be, for example, part of a tester.

In the following, functionalities of the test apparatus are explained using partially model descriptions for explanation reasons. Therefore, the following FIGS. 2-9 describe partially exemplary models of the DUT, a predistortion algorithm and/or correction algorithms.

FIG. 2 shows a schematic block diagram of a non-linear compression model 202 of a DUT to be tested and/or judged by a tester. The model 202 may be used to determine parameters of the correction functions and allows for a simulation of a behavior of a DUT by computing a representation 203 of a DUT output signal based on a representation 201 of the input signal. In other words, the model 202 may be used to model the output signal 203 of a DUT with respect to an input signal by modeling the respective behavior.

The representation 201 of the input signal applied to the model 202 represents the amplitude s[n] and the phase $\sigma[n]$ at the time step n. As the DUT is a real and therefore non-ideal RF power amplifier, the DUT is a compressed amplifier with a reduced gain. Compression of the DUT can be modeled as amplitude-to-amplitude modulation 204 which can be described as a function m(s). The amplitude-to-amplitude modulation 204 leads to the representation 203 of the output signal representing an amplitude r[n] of the output signal. The amplitude r[n] may be determined by the determination rule r[n]=m(s[n]).

The compression of a DUT also leads to a phase shift of the input signal with respect to the output signal. This may be represented by the function $\mu(s)$ denoting a modeling of an amplitude-to-phase modulation 206, wherein $\mu(s)$ is also dependent from the amplitude s[n], a representation thereof respectively. The phase $\rho[n]$ of the output signal can be expressed by the phase $\sigma[n]$ shifted (added) by an additional phase $\mu(s)$ of the amplitude-to-phase modulation 206 expressed by $\rho[n]=\sigma[n]+\mu(s)$. In other words, the compression of a DUT can be modeled by a compression model 202 of the DUT to perform predictions, simulations and/or the like by computing (virtual) output signals based on (virtual) input signals and functions or sets of functions modeling the DUT. Thus, non-linear functions m(s) and/or $\mu(s)$ may lead to a non-linear compression model 202.

A simple representation of a static model of the DUT can for example consist of the first few terms of a Taylor series expansion. This simple representation can be formed as:

$$r[n]=m(r[n])=m_1r[n]+m_2r^2[n]+m_3r^3[n]$$

for the amplitude of the representation 203 and $$\rho[n]=\sigma[n]+\mu(s[n])=\sigma[n]+\mu_1s[n]+\mu_2s^2[n]+\mu_3s^3[n].$$

for the phase of the representation 203.

Exponentials or sigmoid functions may be used to model amplitude compression with fewer terms. As an example, amplitude compression can be modeled as:

$$r[n]=m(s[n])=m_0s[n]+m_1(1-e^{\zeta\cdot s[n]})+m_2(1-e^{2\zeta\cdot s[n]})+m_3(1-e^{3\zeta\cdot s[n]})$$

A model 208 of a Cartesian to polar conversion may be used to transform an representation of an input signal 209 expressed in Cartesian coordinates with an amplitude $I_s[n]$ and a phase $Q_s[n]$ to the representation 208 in polar coordinates. In other words, the inphase component $I_s[n]$ and a quadrature component $Q_s[n]$ represent a signal which is equivalent to a signal represented by s[n] and r[n] except for the type (Cartesian or polar coordinates) of representation.

A model 214 of a polar to Cartesian conversion is configured to transform the representation 203 described in polar coordinates to a representation 216 of the output signal. The representation 216 describes or expresses the (virtual) output signal of the DUT in Cartesian coordinates with an inphase component $I_r[n]$ and a quadrature component $Q_r[n]$.

Both models of transformations 208 and 214 perform a mathematical transformation of a signal while leaving the signal itself unchanged. In the following, signals are denoted in polar coordinates.

Figure 3:
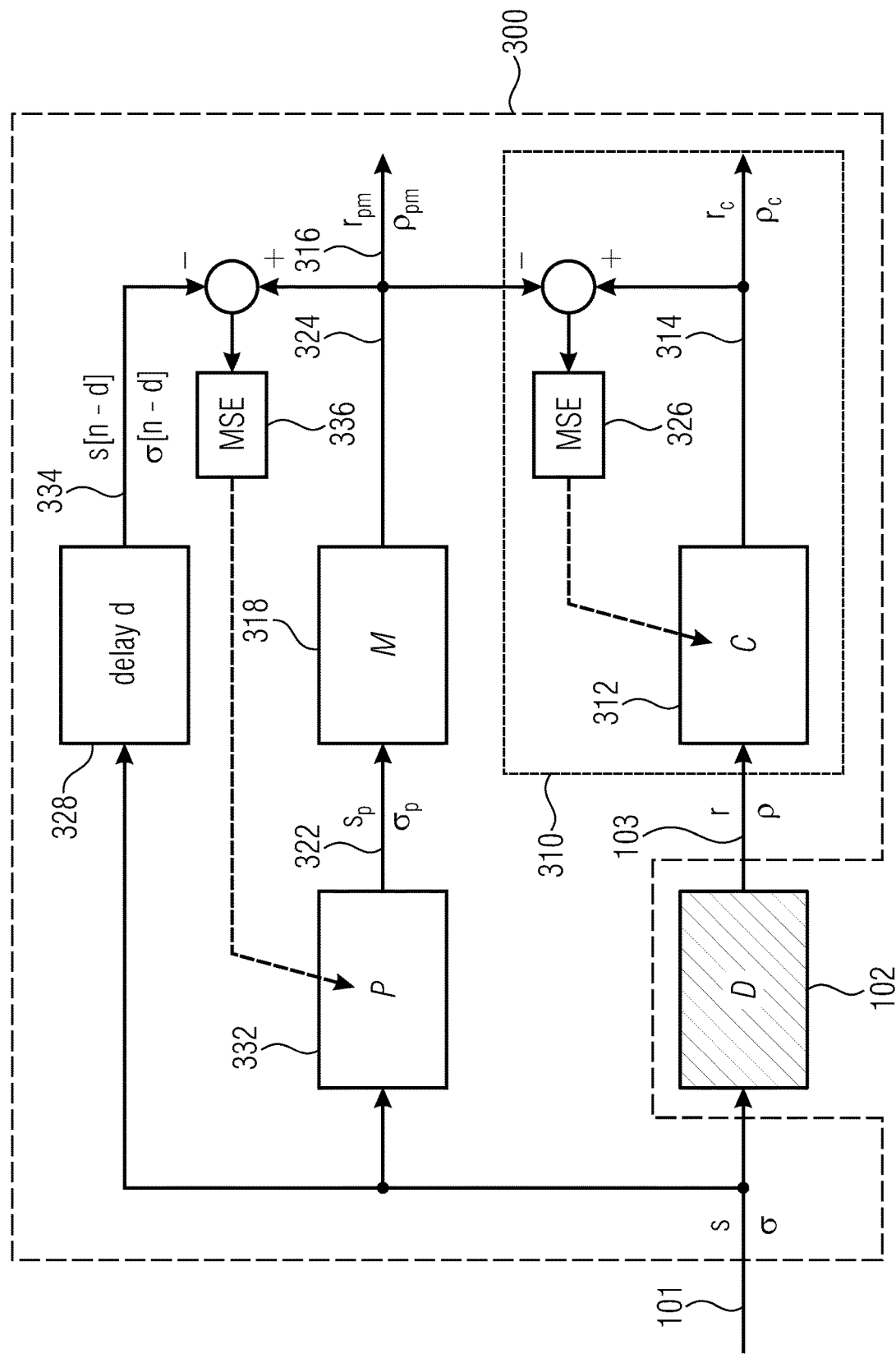
FIG. 3 shows a block schematic diagram of a tester for testing a device under test.

FIG. 3 shows a block schematic diagram of a tester 300 for testing the device under test 102. The tester 300 comprises a test apparatus 310 which may, for example, be equal to the test apparatus 100. The tester is configured to be connectable to the DUT 102, to provide the input signal 101 to the DUT 102 and to receive the response signal 103. The tester 300 is further configured to provide the received response signal 103 to the test apparatus 310. The test apparatus 310 is configured to apply the one or more correction functions to the received response signal 103 and to determine the at least one correction parameter based on the received response signal 103.

For the sake of clarity, the correction functions are depicted as a correction model evaluator 312 (indicated by block C) comprising a correction model of the DUT 102. The correction model evaluator 312 is configured to apply the one or more correction functions to the received response signal 103. The tester 300 may be configured to digitalize the received response signal and to provide a representation, for example, sampled data. In other words, the correction model evaluator may apply the one or more correction functions to the received response signal 103 or a representation thereof. The correction model evaluator 312 depicts the application of the correction functions to the received response signal 103.

The test apparatus 310 is configured to provide a corrected response signal 314 which may be equal to the corrected response signal 105, if the test apparatus 310 is equal to the test apparatus 100.

The correction model 312 may comprise, for example, as a dynamic lookup-table or a polynomial with one or more terms, which may consider, for example, variations or variances within a model range, production line or lot of DUTs resulting in deviations in the received response signal 103. Possibly the correction model considers also one or more potential defects of a DUT, which may occur during production. In case, the correction model does not consider no defects, the test apparatus 310 may be configured to correct the received response signal 103 within variations considered as acceptable by utilizing a lookup table. Variations regarded to be acceptable may be, for example, a maximum or minimum phase compression or delay.

In this example and in the case that the test apparatus 310 is unable to correct the received response signal 103 sufficiently, this can be identified as a hint that the respective DUT 102, unable to be corrected, shows an error or a defect and may be judged as not ok. Alternatively or in addition, the test apparatus 310 may also be configured to determine the correction parameters to completely or almost completely correct the received response signal. Correction parameters indicating a considerably small deviation, i.e., the amplitude and/or phase compression is within a predefined range, may be used as a hint, that a repair or restoring work might be appropriate. The DUT 102 may be identified by the test apparatus 310, when showing deviations which may not fulfill the specification of the respective DUT.

The test apparatus 310 is configured to determine the one or more correction functions of the correction model evaluator 312 on the basis of a desired response signal 316. The desired response signal 316 comprises an amplitude $r_{pm}$ and a phase $\rho_{pm}$.

The desired response signal 316 can be obtained by the tester 300 by determining a predistorted waveform 322 or a representation thereof based on the input signal 101 and by calculating a modeled predistorted output signal 324 with a model evaluator 318 (indicated as block M), configured to modify the predistorted waveform 322 similar to a desired (e.g., error-free) DUT. In other words, the model evaluator is configured to simulate the desired DUT. The model evaluator may be implemented as a circuitry or as software code representing such a circuitry. The tester 300 may be configured to compare the received response signal 103 to the desired response signal 316.

The desired response signal 316 therefore possibly is a signal that would be obtained when performing a predistortion-based test to the DUT 102, such that results obtained from a correction based test may be comparable to the predistortion-based test. Alternatively, the desired response signal 316 may be, for example, a delayed version of the input signal 101. The tester 300 is configured to determine the correction functions of the correction model evaluator 312 based on the desired response signal 316, e.g., by minimizing an error between the desired response signal 316 and a corrected output signal 314, for example by using a mean squared error calculator and parameter adjuster 326. In terms of a parameter adjuster, the mean squared error calculator 326 may be configured to adapt the correction functions to either to minimize an error between the corrected output signal 314 and the desired output signal 316. The corrected output signal 314 may be the corrected output signal 105 when the test apparatus 310 equals the test apparatus 100.

Dependent on the complexity of the correction functions, e.g., a number of terms of Taylor or Volterra series, the error between the desired response signal 316 and the corrected output signal 314 can be reduced or minimized, wherein an increased number of terms of the correction functions may lead to an increased computational complexity and a more detailed modeling of the desired response signal 316, a digital representation thereof respectively, and therefore to a more reduced error.

The model evaluator 318 (nonlinearity model of the DUT 102) can be configured to implement a mathematical expression of the behavior of the DUT 102 (or the compression model), such that the predistorted input signal 322 may be mathematically determined.

In other words, ideal predistortion can minimize an error of the modeled response to the predistorted waveform, compared to a delayed version of the original test waveform, which can be the input signal 101 of the DUT 102 or a digital representation thereof. A delay, implemented for example by a delay block 328, may be, for example, necessitated to obtain a realizable pre-distortion (due to causality reasons) in case of general dynamic non-linearities.

An ideal RF power amplifier with a gain set to 1 provides an output signal that is equal to the input signal of the amplifier with the exception of the delay, modeled by the delay block 328 caused by physical means. Thus, non-ideal behavior of the amplifier, modeled by the model utilized by the model evaluator 318 is aimed to be reduced or minimized by predistorting (pre-equalizing) the digital representation of the input signal 101 with one or more predistortion functions, which functionality is depicted as a predistortion block 332 (indicated by the block P) in FIG. 3, such that distortions of the DUT 102 transcribed by the model of the DUT 102 utilized by the model evaluator 318 are compensated (neutralized or minimized). A deviation between a delayed input signal 334 and a modeled output signal 324 may be reduced or minimized by determining a mean squared error, for example by a mean squared error calculator 336 and by adapting the predistortion block 332 dependent on the mean square error provided by the mean squared error calculator 336.

In the general case, it may be difficult to solve a non-convex optimization problem, because, no matter how the predistortion model or block 332 is parameterized, its parameters map non-linearly through the device model 318 to the error or the deviation between the delayed input signal 334 and the modeled predistorted signal 324. Yet, for any practical predistortion scheme, a method for obtaining the predistortion model or block 332 and the device model 318 can be determined. A straightforward solution $P=M^{-1}$ exists when the model of the model evaluator 318 is invertible, such that the deviation or the mean squared error of the mean squared error calculator 336 may be reduced to zero. When the non-linearity model of the respective evaluator 318 is invertible up to an optional delay d, predistortion P will be chosen to invert the non-linearity, $P=M^{-1}\Delta_d$, where $\Delta_d$ is the delay operator for delay d. In this case, the modeled response $r_{pm}$ to the predistorted stimulus, depicted as predistorted signal 322, or a digital representation thereof, equals the original, delayed stimulus s[n−d], σ[n−d].

Thus, the desired response signal 316 can be, for example, a predistorted modeled output 324 or a delayed version 334 of the input signal 101. In case, the desired response signal 316 is a delayed version 334 of the input signal 101, the desired response signal 316 comprising an amplitude $r_{pm}$ and a phase $\rho_{pm}$ may also be denoted as a signal comprising an amplitude s[n−d] and a phase σ[n−d].

The block diagram of the tester 300 depicts a correction of invertible non-linearities, shown as optimization problem. The tester 300 may be configured to be connected to one or more DUTs 102, e.g., in terms of a test rack comprising the DUTs 102. With such a configuration, the one or more DUTs 102 may be tested during one test cycle. By applying the input signal 101 to each DUT 102 and by adapting the correction functions (the correction block 312) individually for each DUT 102, an individual result of a judgment can be achieved for each DUT 102, e.g., on the basis of the corrected signal 314, while the desired response signal 316 for all DUTs 102 can be based on the model 318, common for all DUTs 102.

By correcting the received response signal 103 and by performing a judgment on the basis of the correction, an upload of an (individual) predistorted waveform to a DUT may be skipped. When applying the (general) input signal 101 to several DUTs at a time, an individual judgment of each DUT may be performed by evaluating (correcting) the received response signal 103 of each DUT. An advantage of such an embodiment may be, for example, that a upload time for one and/or several DUTs may be reduced, as a sequential upload of predistorted waveforms may be saved.

Figure 4:
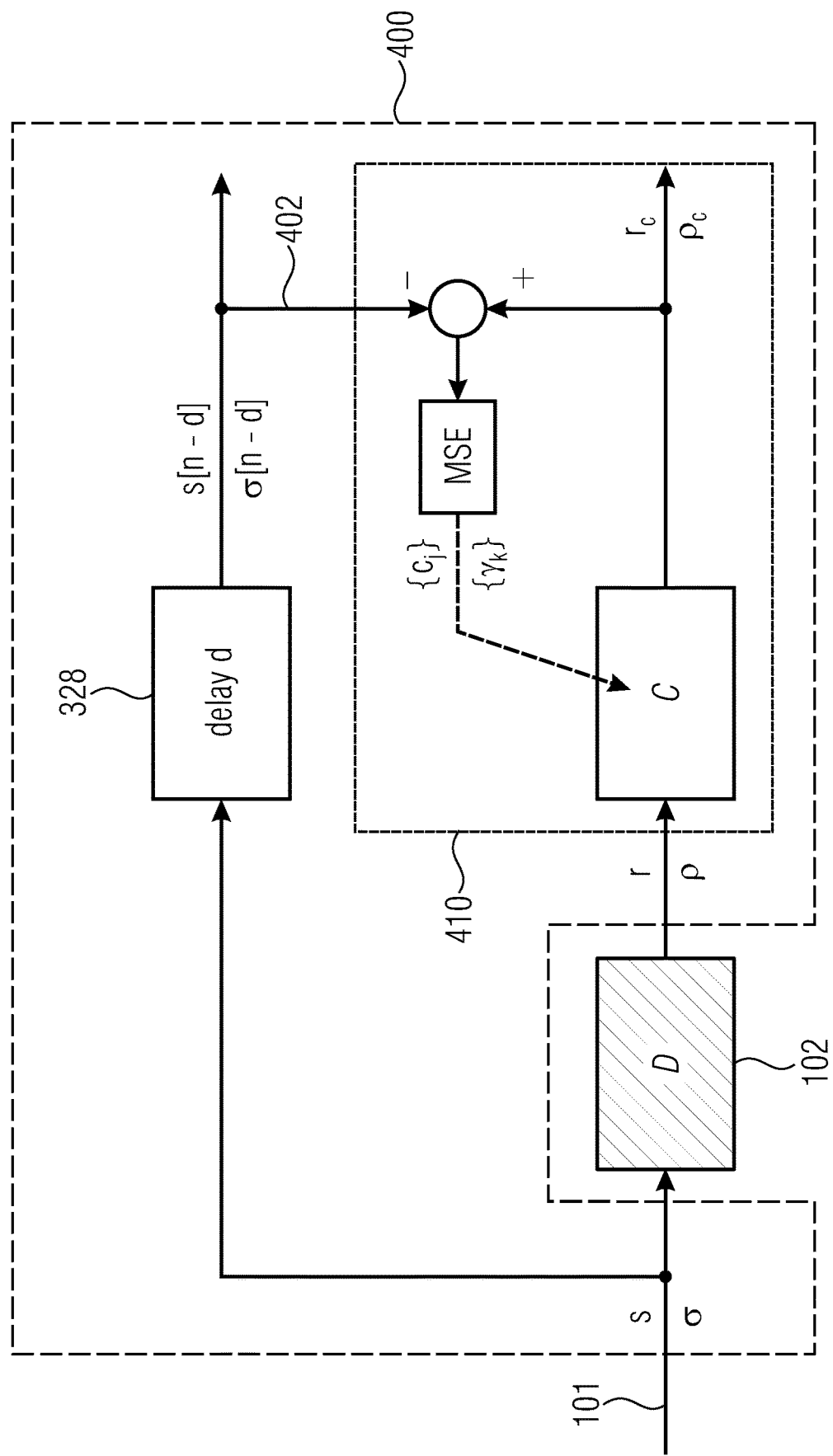
FIG. 4 shows a block schematic diagram of a tester 400 comprising the test apparatus.

FIG. 4 shows a block schematic diagram of a tester 400 comprising a test apparatus 410. The test apparatus 410 may be, for example, one of the test apparatus 100 or 310. The tester 400 is configured to provide, e.g., compute, a desired response signal 402 which is a delayed version of the input signal 101 of the DUT 102 and may be, for example, the signal 334 (FIG. 3) or digital representation thereof.

The input signal 101 (or a digital representation thereof) is delayed by using the delay block 328, such that the amplitude s[n−d] and the phase σ[n−d] are equal to the amplitude s and the phase σ of the input signal 101 with the exception of the delay d.

Thus, FIG. 4 depicts a simplified optimization problem with respect to FIG. 3. The simplification is based on the assumption that the non-linearities of the DUT 102 being invertible leading to an error of approximately zero (dependent on the step size of the mean square error) between the delayed input signal and the desired response signal, such that computation of predistortion P and the model M can be omitted.

Advantages of an invertible non-linearity can therefore be that neither predistortion mapping P nor the non-linearity model M are required to be computed. The correction parameters (coefficients) $\{c_j\}$ and/or $\{\gamma_k\}$ can be fit directly to the original, delayed stimulus s[n−d], σ[n−d] which can be specified by the optimization problem:

$$\{c_j\} = \underset{\{c_j\}}{\operatorname{argmin}} \sum_{n=1}^{N} (r_c[n] - s[n-d])^2$$

$$= \underset{\{c_j\}}{\operatorname{argmin}} \sum_{n=1}^{N} \left( \sum_{j=1}^{J} c_j C_j[n] - s[n-d] \right)^2$$

and/or $$\{\gamma_k\} = \underset{\{\gamma_k\}}{\operatorname{argmin}} \sum_{n=1}^{N} (\rho_c[n] - \rho[n-d])^2$$

$$= \underset{\{\gamma_k\}}{\operatorname{argmin}} \sum_{n=1}^{N} \left( \sigma[n-d] + \sum_{k=1}^{K} \gamma_k \Gamma_k[n] - \sigma[n-d] \right)^2$$

This is equivalent to solving a system of linear equations:

$$\underbrace{\begin{pmatrix} C_1[1] & \cdots & C_J[1] \\ \vdots & \ddots & \vdots \\ C_1[N] & \cdots & C_J[N] \end{pmatrix}}_{C} \cdot \underbrace{\begin{pmatrix} c_1 \\ \vdots \\ c_J \end{pmatrix}}_{c} = \underbrace{\begin{pmatrix} s[1-d] \\ \vdots \\ s[N-d] \end{pmatrix}}_{s}$$

and/or $$\underbrace{\begin{pmatrix} \Gamma_1[1] & \cdots & \Gamma_K[1] \\ \vdots & \ddots & \vdots \\ \Gamma_1[N] & \cdots & \Gamma_K[N] \end{pmatrix}}_{\Gamma} \cdot \underbrace{\begin{pmatrix} \gamma_1 \\ \vdots \\ \gamma_K \end{pmatrix}}_{\gamma} = \underbrace{\begin{pmatrix} \sigma[1-d] \\ \vdots \\ \sigma[N-d] \end{pmatrix}}_{\sigma}$$

with the solution:

$$c = (C'C)^{-1} C's$$

and/or $$\gamma = (\Gamma'\Gamma)^{-1} \Gamma'\rho$$

whereas a direct inversion of the matrix M by computing $(C=M^{-1} \cdot \Delta_d)$ may comprise a high computational effort for general Volterra models.

For this case, dimensions are equal to the step of model fitting, implying identical computation effort.

Figure 5:
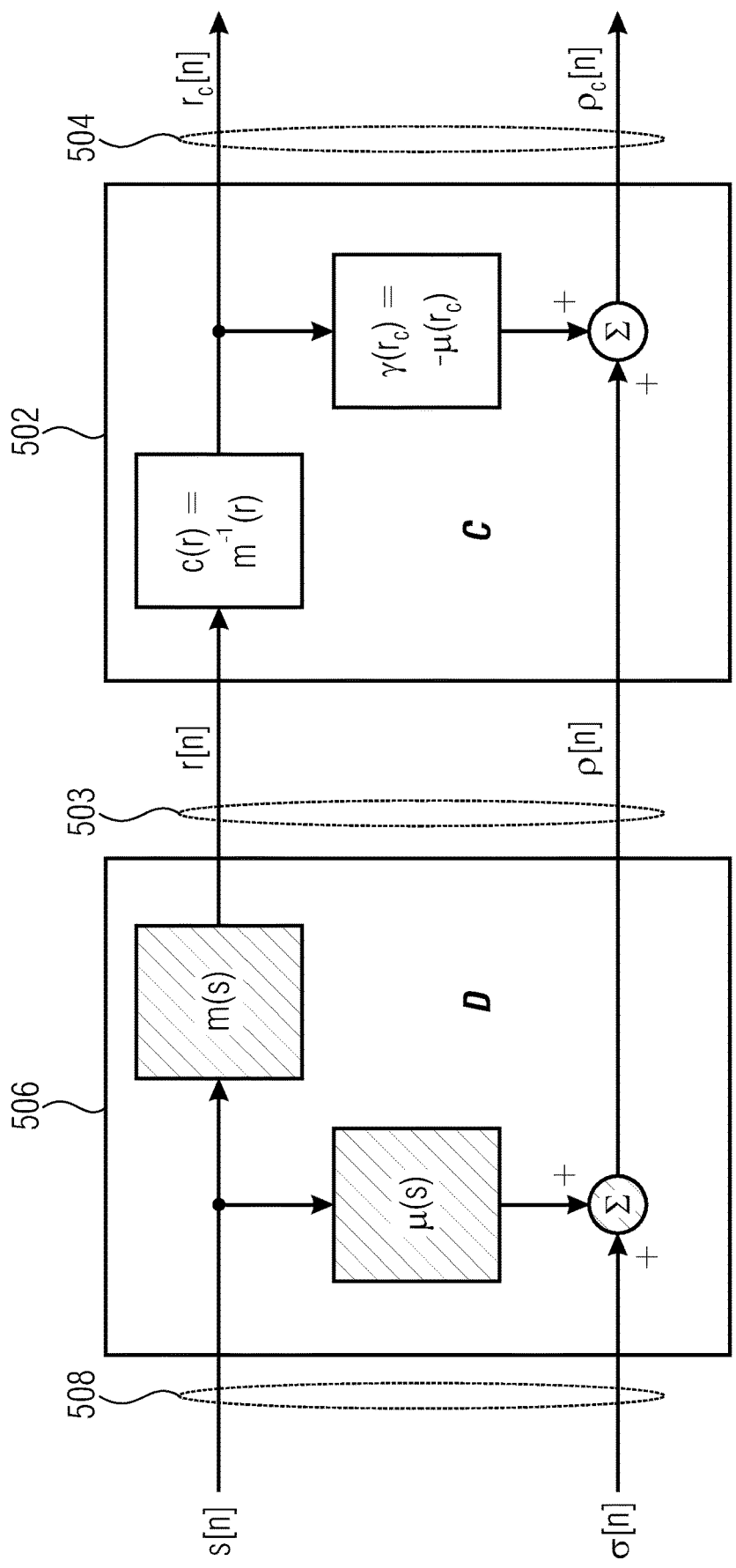
FIG. 5 shows a schematic block diagram of a correction model as an inverted compression model of the DUT.

FIG. 5 shows a schematic block diagram of a correction model evaluator 502. The correction model evaluator can be, for example, the correction model evaluator 312 (FIG. 3)

and is configured to receive a response signal 503 or a digital representation thereof and to provide a corrected signal 504 or a digital representation thereof. The corrected signal 504 may be, for example, the corrected signal 105 (FIG. 1). In other words, the correction model evaluator 502 is a possible realization for correcting the received response signal 503.

A correction model used by the correction model evaluator 502 is depicted as an inverted compression model 506 of the DUT. The compression model 506 is described in FIG. 2 and comprises an invertible amplitude-to-amplitude distortion m(s). Thus, the correction model of the correction model evaluator 502 is adapted to invert the compression model 506. For example, the correction model evaluator 502 can be configured to implement or compute a correction algorithm $c(r)=m^{-1}(r)$ and/or, $\gamma(r_c)=-\mu(r_c)$ which are mirrored (inverted) versions of predistortion described in FIG. 9 and has therefore the same computational complexity. The inverted compression depends on the received response signal 503 with r, ρ instead of the input signal 508 with s, σ. The amplitude of the corrected output signal 504 can be determined according to the determination rule:

$$r_c[n]=c(r[n])=m^{-1}(r[n])$$

wherein the phase shift can be determined according to the determination rule:

$$\rho_c[n]-\rho[n]=\gamma(r_c[n])=-\mu(r_c[n])$$

The correction functions c(.) and γ(.) may be identical to the predistortion functions due to the static (invertible) non-linearity which enables an inversion of the respective model P for predistortion or C for correction, such that the respective equation system may be inverted and a left multiplication or a right multiplication can lead to identical solutions.

$$c(.)=p(.)=m^{-1}(.)$$

$$\gamma(.)=\pi(.)=-\mu(.)$$

For performing inversion of the static non-linearity, in terms of computation the DUT model M comprising the compression model is necessitated.

Figure 6:
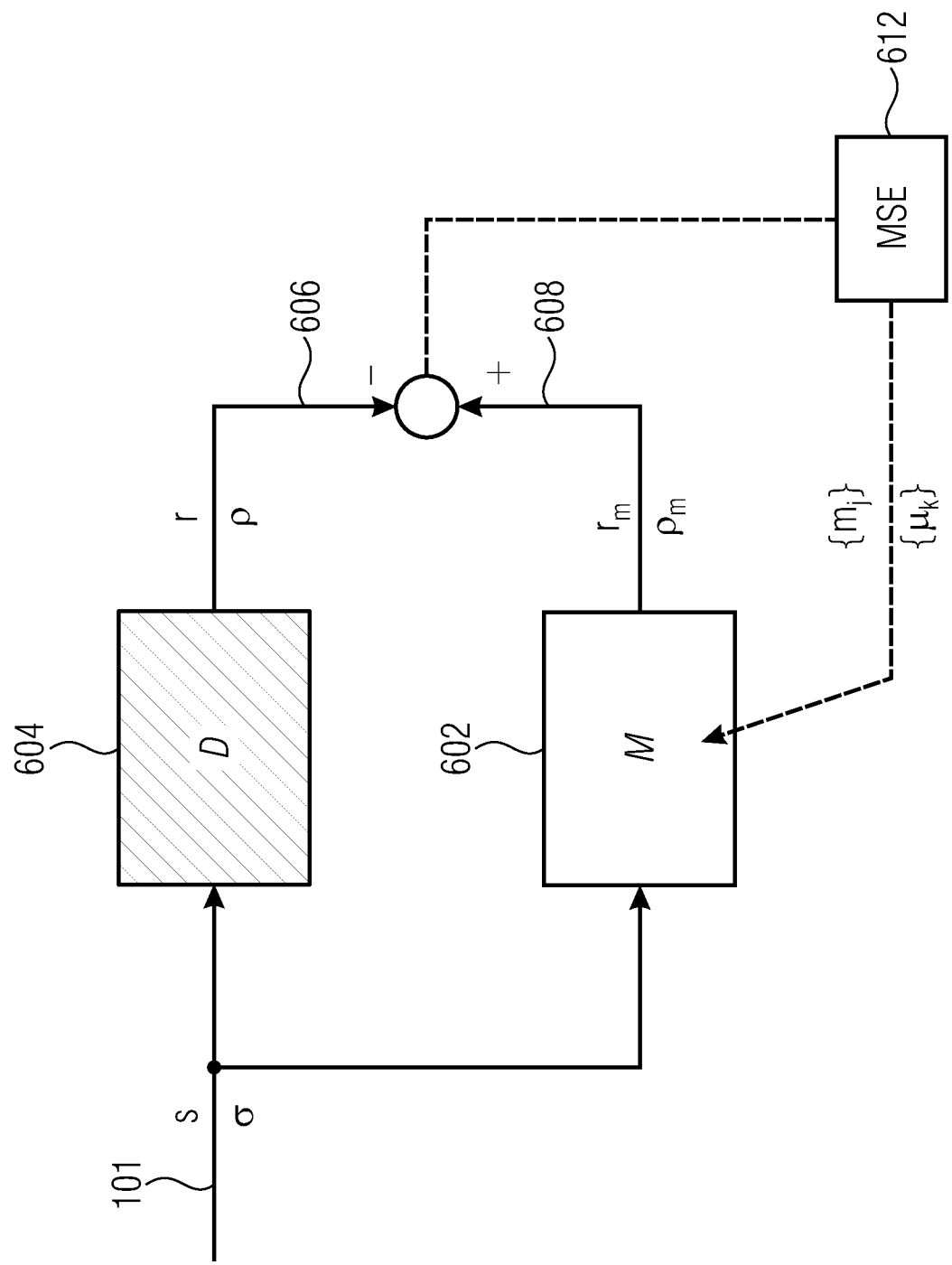
FIG. 6 shows a schematic block diagram of a method for determining the model M of the DUT.

FIG. 6 shows a schematic block diagram of a method for configuring a model evaluator 602 utilizing a model of a DUT 604 to be corrected. The model evaluator 602 may be, for example the model evaluator 318 (FIG. 3). The DUT 604 may be a DUT which is error-free or at least judged as "ok". In other words the DUT 604 may be, for example, a reference DUT such that judging other DUT may be performed by comparing the other DUT to the model of the model evaluator 602, which is a model of the reference DUT 604. The DUT 604 is configured to provide a signal response 606 when receiving the input signal 101. The response signal may be, for example, the response signal 103 (FIG. 3), when the DUT 604 is the DUT 102 (FIG. 3).

The method may comprise a determination of a model (model M) of the DUT 604. Applying the input signal 101 to the DUT 604 allows a reception of the output (response) signal 606 with amplitude r and phase ρ or a digital representation thereof.

The input signal 101 is also input into the coarse, to be adapted model evaluator 602. A modeled output signal 608 with an amplitude $r_m$ and a phase $\rho_m$ or a digital representation thereof can be received from the model evaluator 602. A deviation between the output signal 606 of the DUT 604 and the modeled output signal 608 of the model, e.g. by computing a mean squared error with a mean square error calculator 612, allows a determination or adaption of adaption parameters $\{m_j\}$ for amplitude values and $\{\mu_k\}$ for phase values. The adaption parameters can be used to adapt or modify the model of the model evaluator 602 and to reduce or minimize the deviation between the output signal 606 and the modeled output signal 608, such that a final model comprises an acceptable deviation/error with respect to the real DUT.

The model of the DUT 604 covers the non-linear compression model, such that a fitting of model can comprise a direct fitting of the non-linear compression model. The model coefficients $m_j$ and $\mu_k$ can be computed by applying stimulus s[n], σ[n], for n=1 . . . N to the DUT 604 and by fitting the received response signal 606 of the DUT 604 to the modeled response 608, expressed by r=m(s) and ρ=σ+μ(s) by minimizing the deviation, e.g. the mean square amplitude and phase errors by the mean square error calculator 612.

The model M, for example used by the model evaluator 602 respectively, can be expressed by $$M: \begin{cases} \{m_j\} = \underset{\{m_j\}}{\mathrm{argmin}} \sum_{n=1}^{N} (r[n] - r_d[n])^2 = \underset{\{m_j\}}{\mathrm{argmin}} \sum_{n=1}^{N} \left( \sum_{j=1}^{J} m_j T_j[n] - r_d[n] \right)^2 \\ \{\mu_k\} = \underset{\{\mu_j\}}{\mathrm{argmin}} \sum_{n=1}^{N} (\rho[n] - \rho_d[n])^2 = \underset{\{\mu_j\}}{\mathrm{argmin}} \sum_{n=1}^{N} \left( \sigma[n] + \sum_{k=1}^{K} \mu_k \Theta_k[n] - \rho_d[n] \right)^2 \end{cases}$$

Because r[n] and ρ[n] are modeled as weighted linear sums of basis function values $T_j[n]$ (amplitude terms), $\theta_k[n]$ (phase terms), the coefficients $m_j$ and $\mu_k$ can be computed by solving two systems of linear equations:

$$\begin{pmatrix} T_1[1] & \cdots & T_J[1] \\ \vdots & \ddots & \vdots \\ T_1[N] & \cdots & T_J[N] \end{pmatrix} \cdot \begin{pmatrix} m_1 \\ \vdots \\ m_J \end{pmatrix} = \begin{pmatrix} r_d[1] \\ \vdots \\ r_d[N] \end{pmatrix}$$

and/or $$\begin{pmatrix} \Theta_1[1] & \cdots & \Theta_K[1] \\ \vdots & \ddots & \vdots \\ \Theta_1[N] & \cdots & \Theta_K[N] \end{pmatrix} \cdot \begin{pmatrix} \mu_1 \\ \vdots \\ \mu_K \end{pmatrix} = \begin{pmatrix} \rho_d[1] \\ \vdots \\ \rho_d[N] \end{pmatrix}$$

The model M or the model evaluator 602 may be used to determine a desired response signal for correcting a DUT to be judged with a tester as it is depicted, for example, in FIG. 2.

Figure 7:
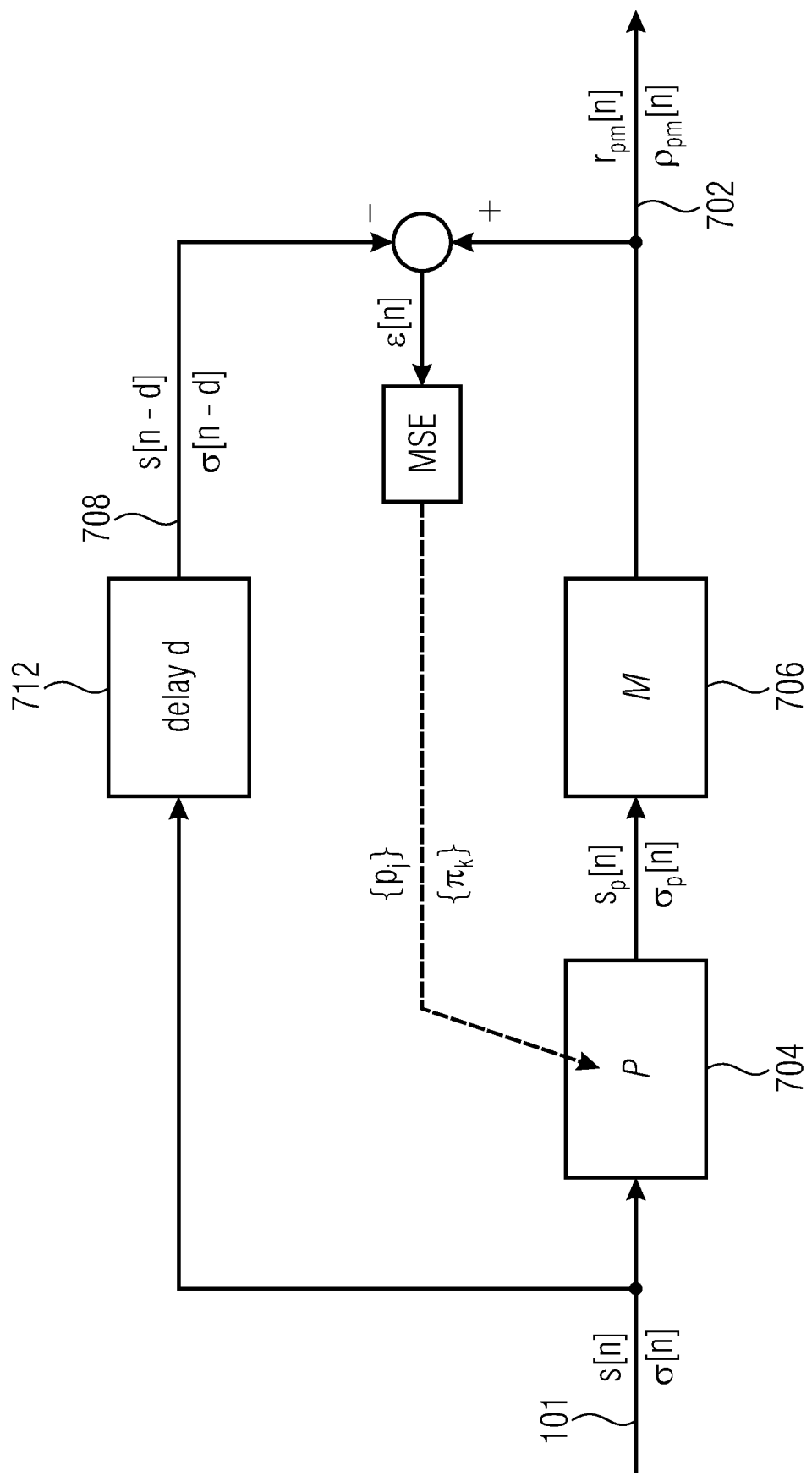
FIG. 7 shows a schematic block diagram of an algorithm for implementing a method for obtaining a desired response signal on the basis of the predistortion model and the model of the DUT.

FIG. 7 shows a schematic block diagram of an algorithm implementing a method for obtaining a desired response signal 702 on the basis of a predistortion model 704 and the model of the DUT evaluated by a model evaluator 706. The model, which may be obtained for example by an algorithm according to FIG. 6, remains unchanged, wherein the predistortion model 704 is adapted by determining parameters $p_j$ and $\pi_k$ for adjusting the predistortion model 704 in amplitude ($p_j$) and phase ($\pi_k$) manners by reducing a deviation or an error between a delayed version 708 (e.g., by a delay block 712) of the input signal 101 (or a digital representation thereof) and the modeled output signal obtained on the basis of a predistorted input signal. The output signal of the model evaluator 706 is considered to be the desired response signal 702 when the error between the signals 708 and 702 is reduced sufficiently.

For static non-linearities (as shown in FIG. 2) amplitude-to-amplitude modulation $m(s_p)$ can be inverted, while additive amplitude-to-phase distortion $\mu(s_p)$ can simply be subtracted as it is described in the following.

The desired response signal may be, for example, the desired response signal 316 (FIG. 3), when the delay block 712 is the delay block 328 such that the algorithm depicted in FIG. 7 may be, for example, implemented by the tester 300 shown in FIG. 3.

Figure 8:
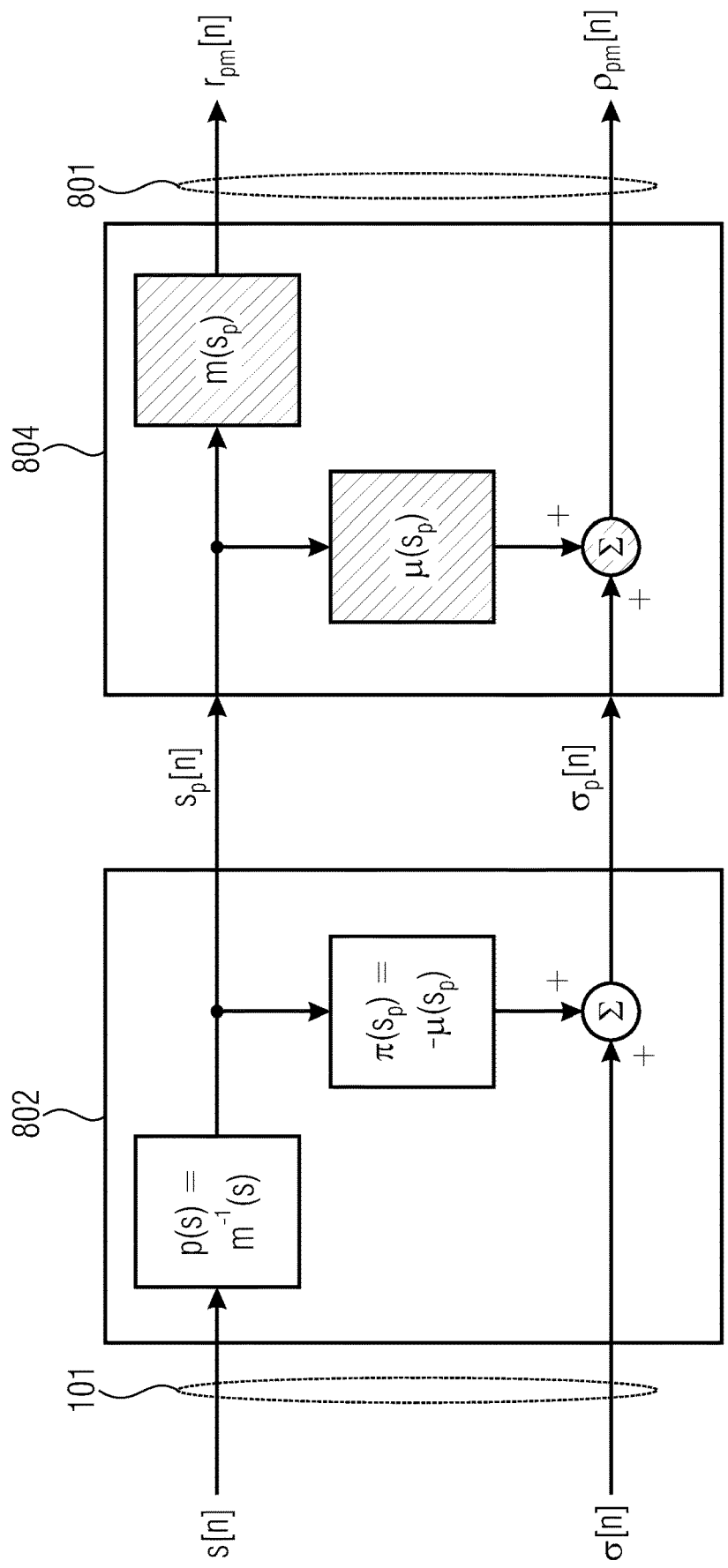
FIG. 8 shows a block schematic diagram of amplitude-to-amplitude modulation and amplitude-to-phase modulation of the predistortion model and the DUT model.

FIG. 8 shows a block schematic diagram of a method for obtaining a desired response signal 801 which may be, for example, the desired response signal 316 (FIG. 3), with an amplitude-to-amplitude modulation and an amplitude-to-phase modulation implemented by a predistortion model evaluator 802 which may be, for example, equal to the predistortion block 332 (FIG. 3). An output signal (or a digital representation thereof) of the predistortion block with an amplitude $s_p[n]$ and a phase $\sigma_p[n]$ are received by a model evaluator 804 which may be, for example, the model evaluator 318 (FIG. 3). In other words, predistortion is shown as inverted compression model, such that FIG. 8 may be described as part of the functionality the tester 300 is configured to provide.

As $p(s)=m^{-1}(s)$, the amplitude $r_{pm}$ of the desired response signal 801 equals the amplitude s of the input signal 101 (or a digital representation thereof). As also the amplitude-to-phase modulation $\pi(s_p)$ is invertible as expressed by $-\mu(s_p)$ the phase $\rho_{pm}$ of the desired response signal 801 equals the phase a of the input signal 101, wherein the desired response signal 801 is formed by the modeled predistorted output signal. An algorithm for static predistortion can be expressed by:

$$\mathcal{P}: \begin{cases} s_p[n] = p(s[n]) = m^{-1}(s[n]) \\ \rho_p[n] - \sigma_p[n] = \pi(s_p[n]) = -\mu(s_p[n]) \end{cases}$$

This predistortion-based approach may be difficult or even very difficult for a general Volterra model, whereas the correction-based method extends nicely, that means with manageable computational effort, to general Volterra models. The computed predistortion waveform $s_p[n]$, $\sigma_p[n]$ can be applied to the device under test, in which the response $r_{pm}[n]$, $\sigma_{pm}[n]$ is then captured and uploaded to a work station and assessed for performance.

Figure 9:
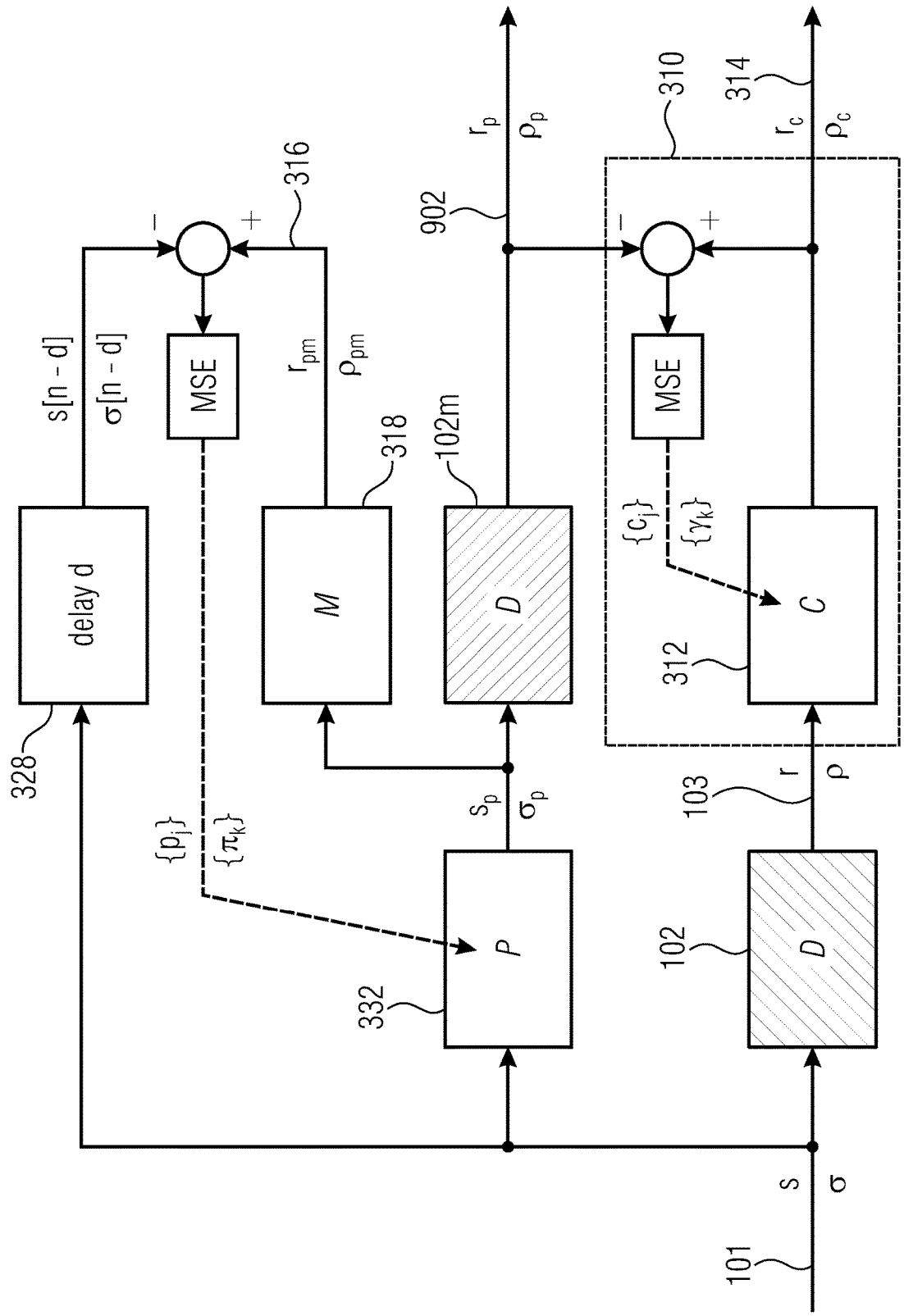
FIG. 9 shows a schematic block diagram of a hypothetical correction-based test algorithm that accurately predicts the effect of predistortion.

FIG. 9 shows a schematic block diagram of a hypothetical correction-based test algorithm that accurately predicts the effect of predistortion, shown as an optimization problem. A real correction-based test as depicted in FIG. 3 can be derived from the hypothetical correction-based test. In other words, the concept according to FIG. 9 may constitute a basis for changing the concept according to the present invention. The hypothetical character of FIG. 9 shall explain the reliability of selecting the modeled predistorted output signal as desired response signal as a proper approximation for a delayed version of the input signal.

To justify substituting predistortion with correction, the corrected response signal $r_c$, $\rho_c$ of the DUT response signal r, $\rho$ to the original stimulus, the input signal, s, $\sigma$ should equal (at least approximately) the DUT response $r_p$, $\rho_p$ to a predistorted stimulus $s_p$, $\sigma_p$. A modeled version $r_{pm}$, $\rho_{pm}$ of the DUT response $r_p$, $\rho_p$ can be optimized to approximate a delayed version of the original stimulus s, $\sigma$.

A signal 902 or a digital representation thereof represents the response of a DUT 102m when receiving a predistorted waveform from the predistortion block 332 and is considered as a predistorted response signal comprising an amplitude $r_p$ and a phase $\rho_p$. In contrast, the corrected response signal 314 is obtained by first inputting the input signal 101 to the DUT 102 and correcting the DUT output 103 with the correction functions of the correction model evaluator 312.

Fitting an (exact) correction model C for the correction model evaluator 312 would necessitate an exact device model M because the predistortion coefficients $p_j$ and $\pi_k$ may be computed from the model evaluator 318, whereas the corrected response signal 314, which may be the corrected response signal 314, is aimed to match the response of the modelled device under test 102m to the predistorted stimulus $s_p$, $\sigma_p$ as opposed to the response of model M. The desired response 902 of the DUT 102 to the predistorted stimulus $s_p$, $\sigma_p$ may be unknown, e.g., because the whole purpose of correction-based test is avoiding a predistortion-based test with stimulus $s_p$, $\sigma_p$ to obtain response $r_p$, $\rho_p$. As a possible next best approximation, the corrected response $r_c$, $\rho_c$ should approximate the modeled response 316 with $r_{pm}$, $\rho_{pm}$ to predistortion.

In other words, a correction-based test as depicted in FIG. 3 aims to reduce a deviation between the corrected response signal 314 and the modeled predistorted signal, such that performing a (real) correction-based test allows for avoiding an upload of a predistorted (individual) waveform to the DUT 102. This enables to also avoid applying the predistorted stimulus to the DUT and enables a correction-based test as depicted in FIG. 3.

A model of the DUT's non-linearity is therefore possibly not required. The correction model may be fit directly to the desired response.

The modeled response $r_{pm}$, $\rho_{pm}$ to the predistorted stimulus $s_p$, $\sigma_p$ can be computed from a predistortion mapping 332 (indicated by the block P) which can be devised by the designers of the DUT 102 and the non-linearity model for a corresponding calculator 318 (as indicated by the block M) obtained by the above described methods.

Figure 10:
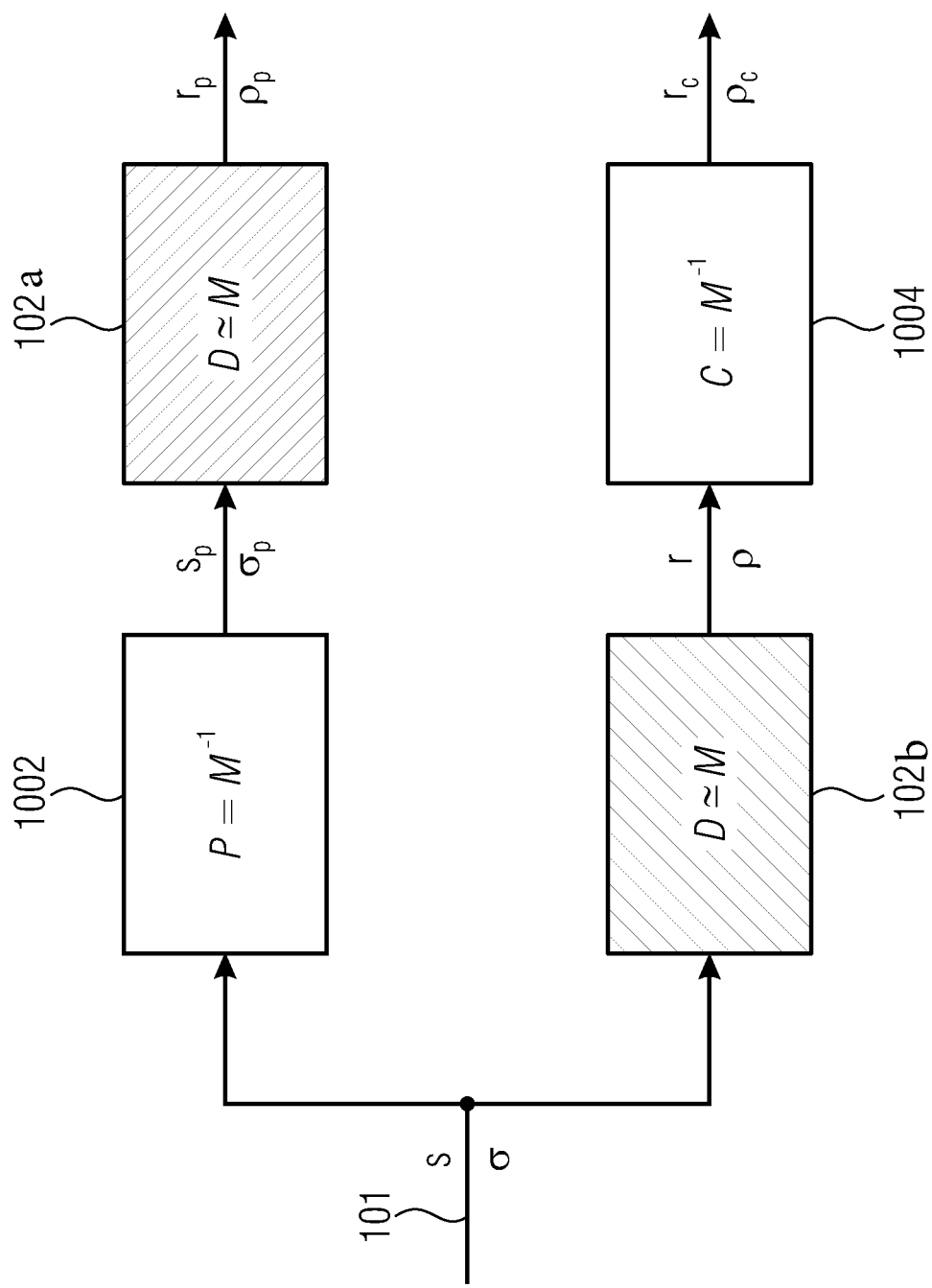
FIG. 10 shows a schematic block diagram depicting similarities and differences between predistortion and correction based tests.

FIG. 10 shows a schematic block diagram depicting similarities and differences between predistortion and correction based tests having reverse order of DUT and inverse DUT model.

A predistortion-based test, depicted on the upper side of FIG. 10 aims to invert the model M by block 1002, indicated by "P" of the DUT and to predistort the stimulus signal 101 before inputting the predistorted signal to the DUT 102a in which the inverse model M is used for predistortion. In contrast, a correction-based test, depicted on the lower side of FIG. 10, first inputs the input signal 101 to the DUT 102b and then tries to correct with block 1004, indicated as "C" received response signal using the inverted model of the DUT 102b. As the predistorted stimulus has to be computed individually for each DUT 102a and has then to be applied to each individual DUT 102a, while in the correction-based test the same input signal may be applied to all DUTs 102b tested at a time and the response may be corrected individually, a significant amount of test time may be saved.

To the extent that the DUT 102a and 102b behaves exactly as modeled, i.e., D=M, predistortion and correction are mathematically equivalent, since $M(M^{-1}) M^{-1}(M)$ holds for any invertible mapping M, with equal input and output domain. When an invertible function y=f(x) and its inverse function $x=f^{-1}(y)$ are considered, inserting them into each other yields $y=f(f^{-1}(y))$ and $x=f^{-1}(f(x))$, revealing that both $f(f^{-1}(.))$ and $f^{-1}(f(.))$ are identity mappings and thus equal, since their input and output domains are equal. For unmodeled DUT behavior, D≠M, the order of $M^{-1}$ and D cannot be reversed. The validity of this assumption can be proven experimentally to also prove engineering intuition that suggests that a difference between predistortion and correction is small enough for small compressions of the DUT 102a and 102b. Furthermore, predistortion-based test and correction-based test apply a slightly different stimulus waveform to the DUT 102a and 102b. Predistortion can be a non-linear mapping that widens the spectrum of the DUT input 101, whereas the correction-based approach can widen the DUT output spectrum. To reduce this difference, correction-based test could use a typical predistorted waveform as stimulus (which is typically not adapted to an individual DUT).

For both reasons, the accuracy of correction-based test can be verified by comparing the performance of the corrected waveform $r_c$, $\rho_c$ with the performance of the response $r_c$, $\rho_c$ to the predistorted stimulus waveform $s_p$, $\sigma_p$, accordingly.

In other words, when amplitude-to-amplitude distortion is invertible, e.g., when only static non-linearities exist, inversion is exact. In correction-based tests, the inverse (correction) follows the DUT 102b, whereas in predistortion-based tests, the inverse (predistortion) precedes the DUT 102a.

Figure 11:
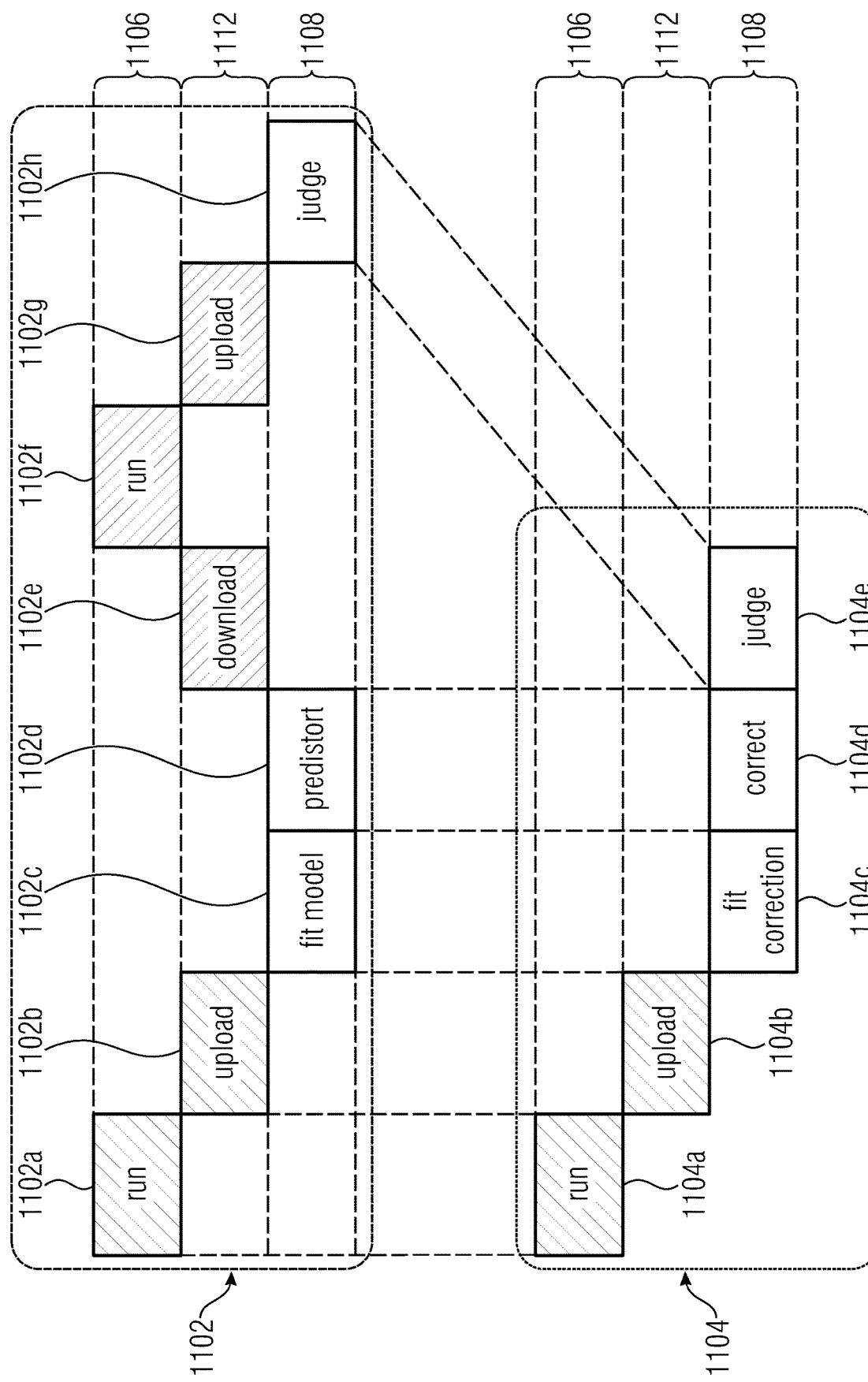
FIG. 11 shows a schematic comparison between a method for performing the predistorted-based test procedure and a method for performing a correction-based test of a DUT.

FIG. 11 shows a schematic comparison between a conventional method 1102 for performing the predistorted-based test procedure and a method 1104 for performing a correction-based test of a DUT. The test goal of the predistorted-based test can be, for example, to determine the remaining non-linearity when predistortion is applied. A straightforward test approach, called the predistortion-based test, consists of steps 1102a-h. In the step 1102a, the device under test is stimulated with a fixed, realistic test stimulus, e.g., from an arbitrary waveform generator (AWG). Its response is uploaded to a workstation in step 1102b. The workstation fits the non-linear compression model to the test stimulus and the received response in step 1102c. In step 1102d, the workstation computes a predistorted waveform, for example, using the predistortion block 332 of tester 300, in an effort to invert the DUT's non-linearities. In step 1102e, this predistorted waveform is downloaded to the AWG and applied to the DUT using the AWG which runs the predistorted waveform in step 1102f. The response to the predistorted waveform is then uploaded to the workstation in step 1102g and judged based on performance parameters such as adjacent channel power ratio (ACLR). Thus, predistorted waveforms must be computed and downloaded individually for all DUTs, which adds considerable test time, in particular for multi-side test, even more so when downloads occur sequentially.

Instead of running an additional predistorted test waveform with method 1104, the effect of predistortion is predicted by correcting the response of the DUT to the uncorrected test waveform as a post-processing step on the workstation. In a first step 1104a the uncorrected test waveform is run on the DUT (fed to the DUT). In a second step 1104b the DUT's response to the waveform is uploaded to the workstation, for example, the tester 300. In a step 1104c the correction functions are determined or adapted. The step 1104c may be, for example performed by the test apparatus 310, so that in a step 1104d a corrected response signal is obtained by the tester performing the method, e.g., a workstation. The predicted response to the predistorted test waveform is then judged, e.g., with the same algorithm as used for predistortion-based tests, such as ACLR.

A number of DUT steps 1106 which are performed on the respective DUT also may be similar or equal for predistortion-based tests and for correction-based tests. A number of computation steps 1108 counts three (fit the predistortion model, predistort and judge) for predistortion-based tests and also three (fitting the correction model, correcting and judging) for correction based test. An advantageous difference between correction-based test forms 1104 with respect to the predistortion-based test 1102 is that a number of data transfer steps 1112 may only count one for correction based tests 1104 when uploading the response signal of the DUT to the test apparatus in step 1104b. In contrast, predistortion-based tests may necessitate three data transfer steps when uploading the DUT response to the respective test apparatus in step 1102b, when downloading the predistorted waveform to the AWG (or DUT) in step 1102e and when uploading the DUT's response to the respective test apparatus in step 1102g. Especially step 1102e may necessitate an individual test waveform for each DUT so that a high amount of test time is necessitated for uploading predistorted waveforms without actually testing DUTs during the upload time. The correction-based test 1104 can be performed without an individual download of test waveforms.

In other words, by using the method 1104 for performing the correction-based test, the test time for downloading and running the predistorted waveform and capturing the device's response can be eliminated. The proposed method of correction-based tests therefore can eliminate this time-consuming step altogether.

By performing correction-based tests, substantially faster test times can be achieved than by performing predistortion-based tests, since they eliminate the need to download and run device-specific predistorted baseband waveforms. A pass/fail determination (judgment) can then be based on the response to one single test stimulus that is common to all devices, and can thus remain preloaded in an arbitrary waveform generator.

As an additional benefit, correction-based tests can be easily extended to any type of frequency-dependent non-linearity, e.g., described by Volterra models.

Predistortion-based tests may remain necessitated for characterization to validate the applicability of correction-based tests.

In other words, FIG. 11 shows a comparison between conventional predistortion-based test and the proposed correction-based test, which can eliminate the need for downloading and running a second, time-consuming predistorted waveform.

Although preceding explanations show that correction-based test can be exact for accurately modeled devices, the accuracy of the proposed method can be verified based on actual device data, since no model is perfect. Correction based test can be described as an approximation of (true) predistortion-based test, such that a verification based on actual device data may ensure the reliability of the correction-based test. The validation may be performed, for example, by a predistortion-based test for one or a number of DUT.

In other words, by performing correction-based test 1104, a correction of a response to an original test waveform is performed as opposed to running a second test with a predistorted waveform.

As an advantage, correction-based test enables a fast test time which may be even significantly faster. A corrected response or the correction parameters of the correction functions are utilized instead of a predistorted waveform to judge DUTs. This can eliminate a second test step, leading to significantly shorter test times. A judging can comprise judging amplitude or a magnitude as well as a phase of the corrected response signal. Alternatively or in addition, the correction parameters of the correction functions may be judged, such as to be within certain parameter boundaries.

Figure 12:
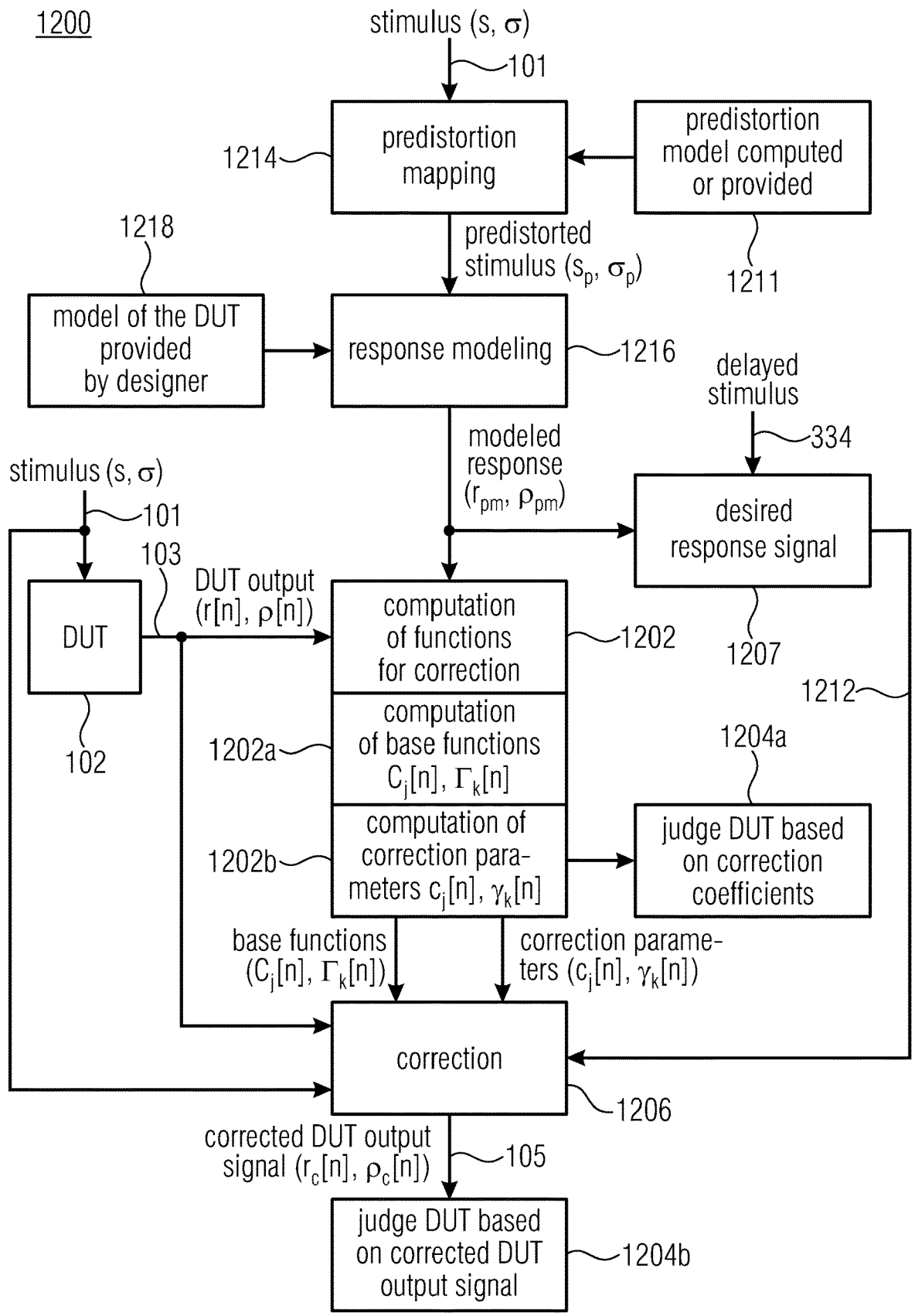
FIG. 12 shows a schematic diagram of a method for testing a device under test.

FIG. 12 shows a schematic diagram of a method 1200 for testing a device under test according to an embodiment of the invention. In a step 1202 the response signal 103 is received from the DUT 102 and correction functions are computed. A Step 1202a may be a sub-step of the step 1202 and comprises a computation of base functions $C_j$ and/or $\Gamma_k$. In a step 202b which may be a sub-step of the step 1202, correction parameters c and/or $\gamma_k$ are determined, such that an application of the correction functions (comprising the base functions $C_j$ and/or $\Gamma_k$ and the correction parameters $c_j$ and/or $\gamma_k$) to the received response signal 103 is configured to correct the received response signal 103 with respect to a desired response signal 1212, which may be, for example, one of the desired response signals 316, 402, 702 or 801, a delayed version of the stimulus or a modeled response $r_{pm}$, $\rho_{pm}$. In a step 1204a the DUT is judged based on the correction parameters computed in the step 1202b. A fail decision can be performed, for example, when one or more correction parameters $c_j$, $\gamma_k$ exceed certain pre-defined limits (optional judgment). In a step 1206 the correction functions (base functions $C_j$, $\Gamma_k$ and correction parameters $c_j$ and $\gamma_k$) are applied to the received response signal 103 to correct it with respect to the desired response signal 1212. The desired response signal 1212 is determined in a step 1207. Correction 1206 is performed, such that a corrected DUT output signal 105 approximates the desired response signal 1212. In a step 1204b the DUT 102 is judged based on the corrected DUT output signal 105.

The modeled response signal $r_{pm}$, $\rho_{pm}$ is obtained in a step 1214 for predistortion mapping by determining the predistorted stimulus $s_p$, $\sigma_p$ based on the stimulus (input signal 101 with s, σ) based on the predistortion model which is computed or provided at a step 1211. In a step 1216 the desired response signal 1212 is determined based on the predistorted stimulus $s_p$, $\sigma_p$ and based on the model of the DUT which may be provided by the designer of the DUT in a step 1218.

Judging the DUT may be done in the step 1204a and/or in step 1204b. In step 1204a the judgment is based on the determined correction coefficients $c_j$ and $\gamma_k$, wherein judgment based on the corrected DUT output signal in step 1204b may utilize a signal analysis such as comparing magnitudes and/or phases of input and output signals of the DUT instead of determining correction parameters being within certain predefined ranges.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A test apparatus for testing a device under test -DUT-, comprising:
   a tester configured:
      to receive a response signal from the device under test (DUT);

to apply one or more correction functions to the received response signal to at least partially correct an imperfection due to behavior of the DUT to acquire a corrected response signal of the DUT, wherein the tester is configured to determine amplitude correction and a phase correction, wherein:

the amplitude correction is determined according to a sum of basis functions corresponding to the determination rule $$C_j[n]=C_j(r[n])$$

and
the phase correction is determined according to a sum of basis functions corresponding to the determination rule $$\Gamma_k[n]=\Gamma_k(r[n])$$

wherein:
Cj[n] denotes a basis function for amplitude correction with index j at time step n;
r[n] denotes a history amplitude vector of the received response signal of the DUT at time step n; and
$\Gamma_k$[n] denotes a basis function for phase correction with index k at time step n; and
to evaluate the corrected response signal to judge the DUT.

2. The test apparatus according to claim 1 wherein
the tester is further configured to
determine at least one correction parameter of one or more correction functions that are adapted to at least partially correct an imperfection of the DUT when the one or more correction functions are applied to the received response signal.

3. The test apparatus according to claim 1, wherein the one or more correction functions are adapted to at least partially correct the imperfection of the DUT, the imperfection comprising a static non-linearity of the DUT between an input signal of the DUT and the received response signal of the DUT based on the input signal.

4. The test apparatus according to claim 1, wherein the one or more correction functions are adapted to at least partially correct the imperfection of the DUT, the imperfection comprising a dynamic non-linearity of the DUT between an input signal of the DUT and the received response signal of the DUT based on the input signal.

5. The test apparatus according to claim 1, wherein the tester is further configured to determine the one or more correction functions on the basis of a desired response signal of the DUT and the received response signal of the DUT.

6. The test apparatus according to claim 5, wherein a deviation between a corrected response signal of the DUT and the desired response signal of the DUT is reduced when compared to a deviation between the received response signal of the DUT and the desired response signal of the DUT.

7. The test apparatus according to claim 5, wherein the desired response signal of the DUT is a delayed version of an input signal of the DUT.

8. The test apparatus according to claim 5, wherein the desired response signal of the DUT is a modeled output signal of the DUT that is generated on the basis of a predistorted signal input into a model of the DUT; wherein the tester is configured to determine the one or more correction functions in a manner that the corrected output signal approximates the modeled output signal within a predetermined tolerance range.

9. The test apparatus according to claim 8, wherein the tester is configured to determine the predistorted signal on the basis of a predistortion model and an input signal.

10. The test apparatus according to claim 9, wherein the tester is further configured to determine the modeled output signal of the DUT on the basis of the predistorted signal and the model of the DUT, wherein the modeled output signal approximates a signal that is generated by applying the predistorted signal to the DUT.

11. The test apparatus according to claim 1, wherein the tester is further configured to determine the one or more correction functions by using at least one basis function.

12. The test apparatus according to claim 11, wherein the tester is configured to determine the one or more correction functions comprising a correction parameter defining a weighting of the at least one basis function.

13. The test apparatus according to claim 11, wherein the tester is configured to determine the one or more correction functions on the basis of Volterra series, wherein the one or more correction functions comprise a number of Volterra coefficients.

14. The test apparatus according to claim 11, wherein the tester is configured to determine the one or more correction functions on the basis of Volterra series, wherein the one or more correction functions comprise a number of less than or equal to 15 Volterra coefficients.

15. The test apparatus according to claim 1, wherein the time step n corresponds to a sample step during sampling a signal.

16. The test apparatus according to claim 1, wherein the tester is configured to acquire an amplitude of the corrected response signal on the basis of the determination rule $$r_c[n] = c(r[n]) = \sum_{j=1}^{J} c_j C_j[n]$$

wherein:
$r_c$[n] denotes the amplitude of the corrected response signal at time index n;
c(r[n]) denotes the overall amplitude correction function c of the vectorized amplitude of the received response signal of the DUT at time index n;
$c_j$ denotes the amplitude correction parameter with index j corresponding to the amplitude basis function $C_j$[n] with index j at time index n; and
J denotes a number of amplitude correction parameters and a number of correction functions.

17. The test apparatus according to claim 16, wherein the tester is further configured to determine the one or more amplitude correction parameters according to the determination rule $$\{c_j\} = \underset{\{c_j\}}{\operatorname{argmin}} \sum_{n=1}^{N} (r_c[n] - r_{pm}[n])^2$$
$$= \underset{\{c_j\}}{\operatorname{argmin}} \sum_{n=1}^{N} \left( \sum_{j=1}^{J} c_j C_j[n] - r_{pm}[n] \right)^2$$

or

-continued $$\underbrace{\begin{pmatrix} C_1[1] & \cdots & C_J[1] \\ \vdots & \ddots & \vdots \\ C_1[N] & \cdots & C_J[N] \end{pmatrix}}_{C} \cdot \underbrace{\begin{pmatrix} c_1 \\ \vdots \\ c_J \end{pmatrix}}_{c} = \underbrace{\begin{pmatrix} r_{pm}[1] \\ \vdots \\ r_{pm}[N] \end{pmatrix}}_{r_{pm}}$$

such that a deviation between the amplitude of the corrected response signal of the DUT and the amplitude of the desired response signal of the DUT is reduced; wherein:
  C denotes a matrix of values of the amplitude basis functions $C_1[.]$ to $C_J[.]$ for time indices 1 to N;
  c denotes a vector of the amplitude correction parameters; and
  $r_{pm}$ denotes a vector of the amplitude of the desired response signal of the DUT vectorizing the amplitude of the desired response signal $r_{pm}[n]$ at time index n for time indices n=1 to N.

18. The test apparatus according to claim 17, wherein the tester is configured to determine the one or more amplitude correction parameters according to the determination rule $$c = (C'C)^{-1} C' r_{pm}.$$

19. The test apparatus according to claim 1, wherein the tester is configured to determine a phase of the corrected response signal on the basis of the determination rule $$p_c[n] = \gamma(r[n]) = \sigma[n] + \sum_{k=1}^{K} \gamma_k \Gamma_k[n]$$

wherein:
  $p_c[n]$ denotes the phase of the corrected response signal at time index n,
  $\gamma(r[n])$ denotes the overall amplitude correction function $\gamma$ of the vectorized amplitude of the received response signal of the DUT at time index n;
  $\gamma_k$ denotes the phase correction parameter with index k corresponding to the phase basis function $\Gamma_k[n]$ with index k at time index n; and
  K denotes a number of phase correction parameters and a number of correction functions.

20. The test apparatus according to claim 19, wherein the tester is further configured to determine the one or more phase correction parameters according to the determination rule $$\{\gamma_k\} = \underset{\{\gamma_k\}}{\operatorname{argmin}} \sum_{n=1}^{N} (p_c[n] - p_{pm}[n])^2$$

$$= \underset{\{\gamma_k\}}{\operatorname{argmin}} \sum_{n=1}^{N} \left( \sigma[n] + \sum_{k=1}^{K} \gamma_k \Gamma_k[n] - p_{pm}[n] \right)^2$$

or $$\underbrace{\begin{pmatrix} \Gamma_1[1] & \cdots & \Gamma_K[1] \\ \vdots & \ddots & \vdots \\ \Gamma_1[N] & \cdots & \Gamma_K[N] \end{pmatrix}}_{\Gamma} \cdot \underbrace{\begin{pmatrix} \gamma_1 \\ \vdots \\ \gamma_K \end{pmatrix}}_{\gamma} = \underbrace{\begin{pmatrix} p_{pm}[1] \\ \vdots \\ p_{pm}[N] \end{pmatrix}}_{p_{pm}}$$

such that a deviation between the phase of the corrected response signal of the DUT and the phase of the desired response signal of the DUT is reduced;

wherein:
  $\Gamma$ denotes a matrix of values of the phase basis functions $\Gamma_1$ to $\Gamma_K$ for time indices 1 to N;
  $\gamma$ denotes a vector of the phase correction parameters; and
  $p_{pm}$ denotes a vector of the phase of the desired response signal of the DUT vectorizing the phase of the desired response signal $p_{pm}[n]$ at time indices n for time indices n=1 to N.

21. The test apparatus according to claim 20, wherein the tester is configured to determine the one or more phase correction parameters according to the determination rule $$\underbrace{\begin{pmatrix} \Gamma_1[1] & \cdots & \Gamma_K[1] \\ \vdots & \ddots & \vdots \\ \Gamma_1[N] & \cdots & \Gamma_K[N] \end{pmatrix}}_{\Gamma} \cdot \underbrace{\begin{pmatrix} \gamma_1 \\ \vdots \\ \gamma_K \end{pmatrix}}_{\gamma} = \underbrace{\begin{pmatrix} p_{pm}[1] \\ \vdots \\ p_{pm}[N] \end{pmatrix}}_{p_{pm}}.$$

22. An apparatus for testing a device under test -DUT-, comprising a system configured to be connected to at least one DUT and to input an input signal to the DUT; wherein the system comprises a test apparatus according to claim 1.

23. A method for testing a device under test -DUT-, wherein the method comprises:
  receiving a response signal from the device under test (DUT);
  applying one or more correction functions to the received response signal to at least partially correct an imperfection due to behavior of the DUT to acquire a corrected response signal; wherein an amplitude correction is acquired on the basis of the determination rule $$r_c[n] = c(r[n]) = \sum_{j=1}^{J} c_j C_j[n]$$

wherein:
  $r_c[n]$ denotes the amplitude of the corrected response signal at time index n;
  $c(r[n])$ denotes the overall amplitude correction function c of the vectorized amplitude of the received response signal of the DUT at time index n;
  $c_j$ denotes the amplitude correction parameter with index j corresponding to the amplitude basis function $C_j[n]$ with index j at time index n; and
  J denotes a number of amplitude correction parameters and a number of correction functions; and
  evaluating the corrected response signal to judge the DUT.

24. A method for testing a device under test -DUT- of claim 23 further comprising:
  determining at least one parameter of one or more correction functions that are adapted to at least partially correct an imperfection of the DUT when the one or more correction functions are applied to the received response signal.

25. A non-transitory digital storage medium having stored thereon a computer program for performing a method for testing a device under test -DUT-, comprising:
  receiving a response signal from the device under test (DUT);
  applying one or more correction functions to the received response signal to at least partially correct an imperfection due to behavior of the DUT to acquire a corrected response signal, wherein the wherein the corrected response signal includes an amplitude correction and a phase correction, wherein:

the amplitude correction is determined according to a sum of basis functions to corresponding to the determination rule $C_j[n] = C_j(r[n])$ and the phase correction is determined according a sum of basis functions corresponding to the determination rule $\Gamma_k[n] = \Gamma_k(r[n])$ wherein:
  Cj[n] denotes a basis function for amplitude correction with index j at time step n; and
  r[n] denotes a history amplitude vector of the received response signal of the DUT at time step n; and
  $\Gamma_k[n]$ denotes a basis function for phase correction with index k at time step n; and evaluating the corrected response signal to judge the device under test DUT, wherein said computer program is run by a computer.

26. A method for testing a device under test -DUT-, wherein the method comprises:

receiving a response signal from the DUT;

applying one or more correction functions to the received response signal to at least partially correct an imperfection due to behavior of the DUT to acquire a corrected response signal wherein a phase correction is acquired on the basis of the determination rule $$\rho_c[n] = \gamma(r[n]) = \sigma[n] + \sum_{k=1}^{K} \gamma_k \Gamma_k[n]$$

wherein:
  $p_c[n]$ denotes the phase of the corrected response signal at time index n,
  $\gamma(r[n])$ denotes the overall amplitude correction function $\gamma$ of the vectorized amplitude of the received response signal of the DUT at time index n;
  $\gamma_k$ denotes the phase correction parameter with index k corresponding to the phase basis function $\Gamma_k[n]$ with index k at time index n; and
  K denotes a number of phase correction parameters and a number of correction functions; and evaluating the at least one parameter of the one or more correction functions to judge the DUT.

* * * * *